United States Patent
Kanai et al.

(10) Patent No.: US 10,879,439 B2
(45) Date of Patent: Dec. 29, 2020

(54) POLYAMIDE COMPOSITION FOR LED REFLECTION PLATE, LED REFLECTION PLATE, AND LIGHT-EMITTING DEVICE INCLUDING REFLECTION PLATE

(71) Applicant: KURARAY CO., LTD., Kurashiki (JP)

(72) Inventors: Shimon Kanai, Tsukuba (JP); Takaharu Shigematsu, Tsukuba (JP)

(73) Assignee: KURARAY CO., LTD., Kurashiki (JP)

( * ) Notice: Subject to any disclaimer, the term of this patent is extended or adjusted under 35 U.S.C. 154(b) by 0 days.

(21) Appl. No.: 15/739,226

(22) PCT Filed: Jun. 28, 2016

(86) PCT No.: PCT/JP2016/069179
§ 371 (c)(1),
(2) Date: Dec. 22, 2017

(87) PCT Pub. No.: WO2017/002825
PCT Pub. Date: Jan. 5, 2017

(65) Prior Publication Data
US 2018/0198043 A1 Jul. 12, 2018

(30) Foreign Application Priority Data
Jun. 29, 2015 (JP) ................................ 2015-129998

(51) Int. Cl.
*H01L 33/60* (2010.01)
*C08K 3/22* (2006.01)
(Continued)

(52) U.S. Cl.
CPC ................ *H01L 33/60* (2013.01); *C08K 3/22* (2013.01); *C08K 5/134* (2013.01); *C08K 5/526* (2013.01);
(Continued)

(58) Field of Classification Search
CPC ............ H01L 33/60; C08G 69/26; C08K 3/22
See application file for complete search history.

(56) References Cited

U.S. PATENT DOCUMENTS

2007/0208128 A1* 9/2007 Jung ........................ C08L 83/04
524/497
2008/0187762 A1* 8/2008 Hayashi ............. B29C 45/2806
428/413
(Continued)

FOREIGN PATENT DOCUMENTS

CN 103328573 A 9/2013
JP 9-48913 A 2/1997
(Continued)

OTHER PUBLICATIONS

Combined Office Action and Search Report dated Sep. 3, 2019 in Chinese Patent Application No. 201680037265.6, citing documents AO and AP therein, 9 pages (with English translation of categories of cited documents).
(Continued)

*Primary Examiner* — Peter Bradford
(74) *Attorney, Agent, or Firm* — Oblon, McClelland, Maier & Neustadt, L.L.P.

(57) ABSTRACT

There is provided a polyamide composition for an LED reflection plate, including a polyamide (A), a titanium oxide (B), a magnesium oxide (C), a phenolic antioxidant (D), and a phosphorus-containing antioxidant (E), wherein the polyamide (A) is a polyamide having a dicarboxylic acid unit comprising 50% by mol or more of 1,4-cyclohexanedicarboxylic acid unit and a diamine unit and having a melting point of 280° C. or higher; the phenolic antioxidant (D) does not have 4 or more phenol structures in its molecule; and the phosphorus-containing antioxidant (E) has 3 or more predetermined structures represented by the formula (1) in its molecule, wherein the content of the titanium oxide (B) is 10

(Continued)

to 100 parts by mass, the content of the magnesium oxide (C) is 0.50 to 15.0 parts by mass, and the content of the phenolic antioxidant (D) is 0.10 to 0.80 part by mass, with respect to 100 parts by mass of the polyamide (A); and the content of the phosphorus-containing antioxidant (E) satisfies the following expression (I);

$$0.25 \leq \text{mass ratio } [(D) \text{ component}/(E) \text{ component}] \leq 3.0 \quad (I).$$

There are also provided a reflection plate obtained by molding the composition, and a light-emitting device having the reflection plate.

13 Claims, 2 Drawing Sheets

(51) Int. Cl.
| | |
|---|---|
| *G02B 5/08* | (2006.01) |
| *C08K 5/134* | (2006.01) |
| *C08K 7/10* | (2006.01) |
| *C08K 5/527* | (2006.01) |
| *C08K 5/526* | (2006.01) |
| *C08L 77/06* | (2006.01) |
| *C08G 69/26* | (2006.01) |

(52) U.S. Cl.
CPC ............... *C08K 5/527* (2013.01); *C08K 7/10* (2013.01); *G02B 5/08* (2013.01); *C08G 69/26* (2013.01); *C08G 69/265* (2013.01); *C08K 2003/222* (2013.01); *C08K 2003/2237* (2013.01); *C08K 2201/014* (2013.01); *C08L 77/06* (2013.01)

(56) References Cited

U.S. PATENT DOCUMENTS

| | | | | |
|---|---|---|---|---|
| 2008/0255283 | A1* | 10/2008 | Aoki | H01L 23/293 |
| | | | | 524/300 |
| 2009/0171013 | A1* | 7/2009 | Taguchi | C08K 3/22 |
| | | | | 524/588 |
| 2009/0304961 | A1* | 12/2009 | Taguchi | C08L 83/04 |
| | | | | 428/35.7 |
| 2010/0148380 | A1* | 6/2010 | Hayashi | C08G 59/42 |
| | | | | 257/793 |
| 2012/0170277 | A1 | 7/2012 | Tamura et al. | |
| 2013/0032933 | A1* | 2/2013 | Fuke | C08K 3/22 |
| | | | | 257/676 |
| 2013/0237660 | A1* | 9/2013 | Iwasaki | H01L 33/46 |
| | | | | 524/531 |
| 2013/0286654 | A1 | 10/2013 | Tamura et al. | |
| 2013/0286655 | A1* | 10/2013 | Tamura | F21V 7/22 |
| | | | | 362/296.02 |
| 2014/0167088 | A1* | 6/2014 | Lu | C08L 83/00 |
| | | | | 257/98 |
| 2014/0191263 | A1* | 7/2014 | Wang | C08L 67/02 |
| | | | | 257/98 |
| 2014/0209969 | A1 | 7/2014 | Bushelman et al. | |
| 2014/0228489 | A1* | 8/2014 | Nakai | C08K 5/529 |
| | | | | 524/120 |
| 2014/0356630 | A1* | 12/2014 | Ouchiyama | C08K 3/346 |
| | | | | 428/419 |
| 2015/0056450 | A1* | 2/2015 | Shan | H01B 3/441 |
| | | | | 428/391 |
| 2015/0109696 | A1* | 4/2015 | Sashi | G02B 1/105 |
| | | | | 359/871 |
| 2015/0301667 | A1* | 10/2015 | Yano | G06F 3/0412 |
| | | | | 345/173 |
| 2015/0337108 | A1* | 11/2015 | Ieda | C08K 3/32 |
| | | | | 524/606 |
| 2016/0053073 | A1* | 2/2016 | Matsui | C01F 5/22 |
| | | | | 523/200 |
| 2017/0210879 | A1* | 7/2017 | Ohshimizu | C08K 3/22 |

FOREIGN PATENT DOCUMENTS

| | | | |
|---|---|---|---|
| JP | 2013-127062 A | | 6/2013 |
| JP | 2014-012773 | * | 1/2014 |
| JP | 2014-12773 A | | 1/2014 |
| JP | 2014-521821 A | | 8/2014 |
| JP | 2015-74763 A | | 4/2015 |
| WO | 2011/027562 A1 | | 3/2011 |
| WO | 2012/101997 A1 | | 8/2012 |
| WO | 2013/129201 A1 | | 9/2013 |
| WO | WO 2014/200082 A1 | | 12/2014 |
| WO | WO 2015/004927 A1 | | 1/2015 |
| WO | WO 2015/087886 A1 | | 6/2015 |

OTHER PUBLICATIONS

International Search Report dated Sep. 27, 2016 in PCT/JP2016/069179 filed Jun. 28, 2016.

Extended European Search Report dated Jan. 22, 2019 in Patent Application No. 16817933.1.

\* cited by examiner

POLYAMIDE COMPOSITION FOR LED REFLECTION PLATE, LED REFLECTION PLATE, AND LIGHT-EMITTING DEVICE INCLUDING REFLECTION PLATE

TECHNICAL FIELD

The present invention relates to a polyamide composition for an LED reflection plate, an LED reflection plate, and a light-emitting device comprising the LED reflection plate.

BACKGROUND ART

In recent years, by making the best use of merits including low power consumption and low environmental load, LEDs (Light Emitting Diodes) are used for various types of products of electric and electronic devices, including small-size displays such as mobile communication devices such as cell phones, medium/large-size displays such as personal computers and liquid crystal TVs, console panels and in-car illumination of cars, household illumination, signboards and display lamps, signals and other household articles.

LEDs are usually used in a form of a LED package; and the LED package is constituted mainly of a light-emitting semiconductor element (LED), lead wire, a reflection plate serving also as a housing, and a transparent encapsulating member to encapsulate the semiconductor element.

As materials to be used for the reflection plate, heat-resistant plastics are known. For example, PTLs 1 to 3 disclose, as compositions to be used for LED reflection plates and the like, compositions containing: a polyamide composed of a dicarboxylic acid unit and a diamine unit wherein the main component of the dicarboxylic acid unit is a 1,4-cyclohexanedicarboxylic acid unit; and titanium oxide.

CITATION LIST

Patent Literature

PTL1: WO2011/027562
PTL2: WO2012/101997
PTL3: JP 2014-012773 A

SUMMARY OF INVENTION

Technical Problem

The reflection plate made of a heat-resistant plastic is required to have heat resistance, since it is exposed to a temperature of 100 to 200° C. for a time ranging into several hours when a conductive adhesive or an encapsulant is thermally cured in LED package production. The reflection plate is further required to cause no color change, etc. and maintain a high light reflectance, at intense heat in LED package production and under the use environment.

There is, however, room for improvement in techniques of PTLs 1 to 3 regarding that the LED reflection plate maintains a high light reflectance in its production or under an environment in its usage, particularly under a high temperature environment.

In consideration of the above situation, the present invention has an object to provide: a polyamide composition for an LED reflection plate which composition can show a small decrease in the light reflectance to maintain a high light reflectance both after short-time heating and after long-term heating even in the case of being exposed to heat supposed in production steps of LED packages and under the use environment; a reflection plate obtained by molding the composition; and a light-emitting device comprising the reflection plate.

Solution to Problem

The present inventors have found that the above problem can be solved by a composition comprising a specific polyamide, titanium oxide and magnesium oxide in predetermined proportions, and concurrently comprising a specific antioxidant in a predetermined proportion.

That is, the present invention relates to the following [1] to [11].

[1] A polyamide composition for an LED reflection plate, comprising a polyamide (A), a titanium oxide (B), a magnesium oxide (C), a phenolic antioxidant (D), and a phosphorus-containing antioxidant (E), wherein the polyamide (A) is a polyamide having a dicarboxylic acid unit comprising 50% by mol or more of 1,4-cyclohexanedicarboxylic acid unit and a diamine unit and having a melting point of 280° C. or higher; the phenolic antioxidant (D) does not have 4 or more phenol structures in one molecule thereof; and the phosphorus-containing antioxidant (E) has 3 or more structures represented by the following formula (1) in one molecule thereof, wherein the content of the titanium oxide (B) is 10 to 100 parts by mass, the content of the magnesium oxide (C) is 0.50 to 15.0 parts by mass, and the content of the phenolic antioxidant (D) is 0.10 to 0.80 part by mass, with respect to 100 parts by mass of the polyamide (A); and the content of the phosphorus-containing antioxidant (E) satisfies the following expression (I):

$$0.25 \leq \text{mass ratio } [(D) \text{ component}/(E) \text{ component}] \leq 3.0 \quad (I).$$

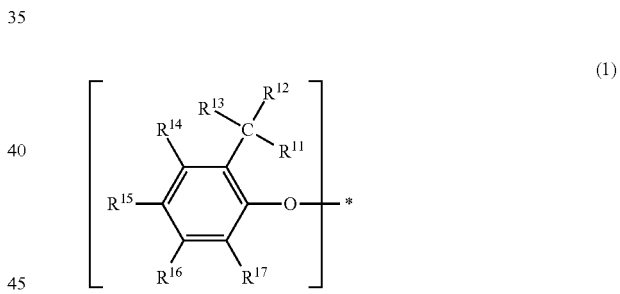

(1)

wherein $R^{11}$ to $R^{13}$ are each independently an alkyl group having 1 or 2 carbon atoms; and $R^{14}$ to $R^{17}$ are each independently a hydrogen atom or an alkyl group having 1 to 10 carbon atoms; and * represents a bonding site with a phosphorus atom.

[2] The composition according to the above [1], wherein the diamine unit of the polyamide (A) comprises 50% by mol or more of an aliphatic diamine unit having 4 to 18 carbon atoms.

[3] The composition according to the above [2], wherein the aliphatic diamine unit is at least one selected from the group consisting of a 1,9-nonanediamine unit and 2-methyl-1,8-octanediamine unit.

[4] The composition according to any one of the above [1] to [3], wherein the phenolic antioxidant (D) has 1 to 3 structures represented by the following formula (2) in one molecule thereof.

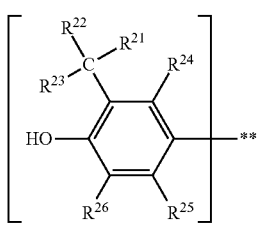

(2)

wherein $R^{21}$ to $R^{23}$ are each independently an alkyl group having 1 or 2 carbon atoms; $R^{24}$ to $R^{26}$ are each independently a hydrogen atom or an alkyl group having 1 to 10 carbon atoms; and ** represents a bonding site.

[5] The composition according to the above [4], wherein in the above formula (2), all of the groups represented by $R^{21}$ to $R^{23}$ are methyl groups; and the group represented by $R^{26}$ is a methyl group or a t-butyl group.

[6] The composition according to any one of the above [1] to [5], wherein the content of the polyamide (A) is 30% by mass or higher and 80% by mass or lower.

[7] The composition according to any one of the above [1] to [6], wherein the BET specific surface area of the magnesium oxide (C) is 50 m²/g or larger.

[8] The composition according to any one of the above [1] to [7], further comprising a reinforcing material (F).

[9] The composition according to any one of the above [1] to [8], further comprising a light stabilizer (G).

[10] An LED reflection plate, being obtained by molding the composition according to any one of the above [1] to [9].

[11] A light-emitting device, comprising the LED reflection plate according to the above [10].

Advantageous Effects of Invention

A reflection plate obtained by molding the polyamide composition for an LED reflection plate of the present invention has a high light reflectance, and can show a small decrease in the light reflectance to maintain a high light reflectance both after short-time heating and after long-term heating even in the case of being exposed to heat supposed in production steps of LED packages and under the use environment. Hence, a light-emitting device comprising the reflection plate comes to have a long life. Further, the polyamide composition for an LED reflection plate of the present invention is excellent also in moldability.

DESCRIPTION OF EMBODIMENTS

[Polyamide Composition for LED Reflection Plate]

Figure 1:
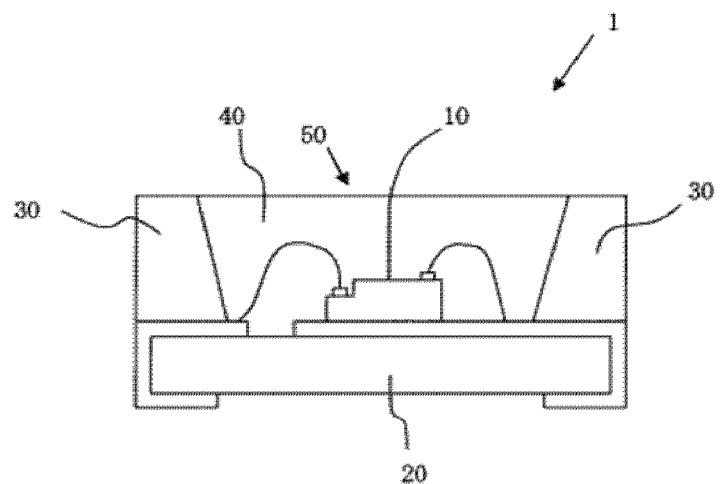
FIG. 1 is a view schematically illustrating one example of a constitution of the light-emitting device of the present invention.

The polyamide composition for an LED reflection plate (hereinafter, simply referred to also as "polyamide composition" or "composition") of the present invention comprises a polyamide (A), titanium oxide (B), magnesium oxide (C), a phenolic antioxidant (D), and a phosphorus-containing antioxidant (E), wherein the polyamide (A) is a polyamide having a dicarboxylic acid unit comprising 50% by mol or more of 1,4-cyclohexanedicarboxylic acid unit and a diamine unit and having a melting point of 280° C. or higher; the phenolic antioxidant (D) does not have 4 or more phenol structures in its molecule; and the phosphorus-containing antioxidant (E) has 3 or more structures represented by the above formula (1) in its molecule, wherein the content of the titanium oxide (B) is 10 to 100 parts by mass, the content of the magnesium oxide (C) is 0.50 to 15.0 parts by mass, and the content of the phenolic antioxidant (D) is 0.10 to 0.80 part by mass, with respect to 100 parts by mass of the polyamide (A); and the content of the phosphorus-containing antioxidant (E) satisfies the following expression (I):

$$0.25 \leq \text{mass ratio } [(D) \text{ component}/(E) \text{ component}] \leq 3.0 \quad (I).$$

Because the polyamide composition of the present invention comprises the above (A) to (E) components in the above proportions, an LED reflection plate can be produced therefrom which has a high light reflectance and can show a small decrease in the light reflectance both after short-time heating and after long-term heating even in the case of being exposed to heat supposed in production steps of LED packages and under the use environment. The reasons therefor are not clear, but are conceivably as follows: the phenolic antioxidant traps radicals generated by heat or light, and further peroxides generated is stabilized by the magnesium oxide or decomposed by the phosphorus-containing antioxidant, whereby these components can cooperatively and effectively block the radical chain reaction to reduce the color change due to oxidative deterioration. Further the additional reason is conceivably as follows: the magnesium oxide probably has the effect of reacting with sites to become starting points of the thermal color change of the polyamide to thereby suppress the thermal color change, whereby the color change can be suppressed synergistically with the above effect.

Further the polyamide composition of the present invention can further comprise a reinforcing material (F) and/or a light stabilizer (G), as required.

<Polyamide (A)>

The polyamide (A) is a polyamide having a dicarboxylic acid unit comprising 50% by mol or more of 1,4-cyclohexanedicarboxylic acid unit and a diamine unit, and in view of the heat resistance of an obtained reflection plate, the melting point of the polyamide (A) is 280° C. or higher.

The dicarboxylic acid unit constituting the polyamide (A) to be used in the present invention, in view of the light resistance of an obtained reflection plate, comprises 50% by mol or more of 1,4-cyclohexanedicarboxylic acid unit. The content of the 1,4-cyclohexanedicarboxylic acid unit in the dicarboxylic acid unit is, in view of the light resistance above mentioned, preferably 60% by mol or higher, more preferably 70% by mol or higher, and still more preferably 90 to 100% by mol. In the case where the content of the 1,4-cyclohexanedicarboxylic acid unit in the dicarboxylic acid unit is lower than 50% by mol, the light resistance of an obtained polyamide composition decreases. Here, the cis:trans ratio of the 1,4-cyclohexanedicarboxylic acid may be in any range.

Usual heat-resistive polyamides have aromatic ring structures in their structures, and in the case where the heat-resistive polyamide having an aromatic ring structure is used for an LED reflection plate, it is presumed that the deterioration of the aromatic ring structure leads to the formation of carboxyl groups to become chromophores, and that the coloration of the reflection plate thus proceeds to thereby result in failure to exhibit a sufficient reflectance and whiteness.

In the present invention, by using the 1,4-cyclohexanedicarboxylic acid unit, which contains no aromatic ring, as the dicarboxylic acid unit constituting the polyamide (A), the formation of carboxyl groups involved in the deterioration is suppressed and when the unit is used for the polyamide for an LED reflection plate, an excellent reflectance and whiteness of the LED reflection plate can be maintained.

The dicarboxylic acid unit constituting the polyamide (A) can comprise dicarboxylic acid units, other than the 1,4-cyclohexanedicarboxylic acid unit, as long as they do not impair the effect of the present invention. Examples of the dicarboxylic acid units other than the 1,4-cyclohexanedicarboxylic acid unit include units derived from aliphatic dicarboxylic acids such as malonic acid, succinic acid, glutaric acid, adipic acid, pimelic acid, suberic acid, azelaic acid, sebacic acid, undecanedicarboxylic acid, dodecanedicarboxylic acid, dimethylmalonic acid, 3,3-diethylsuccinic acid, 2,2-dimethylglutaric acid, 2-methyladipic acid and trimethyladipic acid; alicyclic dicarboxylic acid such as 1,3-cyclopentane dicarboxylic acid, 1,3-cyclohexanedicarboxylic acid, cycloheptanedicarboxylic acid, cyclooctanedicarboxylic acid and cyclodecanedicarboxylic acid; aromatic dicarboxylic acids such as terephthalic acid, isophthalic acid, 1,4-naphthalenedicarboxylic acid, 2,6-naphthalenedicarboxylic acid, 2,7-naphthalenedicarboxylic acid, diphenic acid, 4,4'-biphenyldicarboxylic acid, diphenylmethane-4,4'-dicarboxylic acid and diphenylsulfone-4,4'-dicarboxylic acid; and the like. These units may be in one unit or in two or more units. The polyamide composition can also further comprise units derived from tri- or more polyvalent carboxylic acids such as trimellitic acid, trimesic acid and pyromellitic acid as long as they do not impair the above properties of the polyamide composition and melt-moldability.

The diamine unit constituting the polyamide (A) comprises preferably 50% by mol or more of aliphatic diamine units having 4 to 18 carbon atoms, and more preferably the units in the range of 60 to 100% by mol, still more preferably 70 to 100% by mol, and further still more preferably 90 to 100% by mol. When the content of the aliphatic diamine units having 4 to 18 carbon atoms is 50% by mol or more, the moldability of the composition and the heat resistance of an obtained reflection plate are especially excellent.

Examples of the aliphatic diamine units having 4 to 18 carbon atoms include units derived from straight-chain aliphatic diamines such as 1,4-butanediamine, 1,5-pentanediamine, 1,6-hexanediamine, 1,7-heptanediamine, 1,8-octanediamine, 1,9-nonanediamine, 1,10-decanediamine, 1,11-undecanediamine and 1,12-dodecanediamine; branched-chain aliphatic diamines such as 1-butyl-1,2-ethanediamine, 1,1-dimethyl-1,4-butanediamine, 1-ethyl-1,4-butanediamine, 1,2-dimethyl-1,4-butanediamine, 1,3-dimethyl-1,4-butanediamine, 1,4-dimethyl-1,4-butanediamine, 2,3-dimethyl-1,4-butanediamine, 2-methyl-1,5-pentanediamine, 3-methyl-1,5-pentanediamine, 2,5-dimethyl-1,6-hexanediamine, 2,4-dimethyl-1,6-hexanediamine, 3,3-dimethyl-1,6-hexanediamine, 2,2-dimethyl-1,6-hexanediamine, 2,2,4-trimethyl-1,6-hexanediamine, 2,4,4-trimethyl-1,6-hexanediamine, 2,4-diethyl-1,6-hexanediamine, 2,2-dimethyl-1,7-heptanediamine, 2,3-dimethyl-1,7-heptanediamine, 2,4-dimethyl-1,7-heptanediamine, 2,5-dimethyl-1,7-heptanediamine, 2-methyl-1,8-octanediamine, 3-methyl-1,8-octanediamine, 4-methyl-1,8-octanediamine, 1,3-dimethyl-1,8-octanediamine, 1,4-dimethyl-1,8-octanediamine, 2,4-dimethyl-1,8-octanediamine, 3,4-dimethyl-1,8-octanediamine, 4,5-dimethyl-1,8-octanediamine, 2,2-dimethyl-1,8-octanediamine, 3,3 dimethyl 1,8-octanediamine, 4,4-dimethyl-1,8-octanediamine and 5-methyl-1,9-nonanediamine; and the like. The diamine units can comprise one or more units among these.

The number of carbon atoms of the aliphatic diamine unit is preferably 4 to 12, more preferably 6 to 12, still more preferably 8 to 12, and further still more preferably 9, in view of excellent various physical properties such as the heat resistance and the low water absorbability.

In view of providing a reflection plate excellent in various physical properties such as the heat resistance and the low water absorbability, the aliphatic diamine unit having 4 to 18 carbon atoms is preferably a unit derived from at least one selected from the group consisting of 1,4-butanediamine, 1,6-hexanediamine, 2-methyl-1,5-pentanediamine, 1,8-octanediamine, 2-methyl-1,8-octanediamine, 1,9-nonanediamine, 1,10-decanediamine, 1,11-undecanediamine and 1,12-dodecanediamine. In view of the heat resistance of the polyamide (A), the unit is more preferably at least one selected from the group consisting of a 1,9-nonanediamine unit and a 2-methyl-1,8-octanediamine unit and still more preferably a 1,9-nonanediamine unit and a 2-methyl-1,8-octanediamine unit.

In the case where the diamine unit comprises both a 1,9-nonanediamine unit and a 2-methyl-1,8-octanediamine unit, the molar ratio of a 1,9-nonanediamine unit and a 2-methyl-1,8-octanediamine unit is preferably in the range of a 1,9-nonanediamine unit/a 2-methyl-1,8-octanediamine unit=95/5 to 40/60, and more preferably in the range of 90/10 to 50/50, and still more preferably in the range of 90/10 to 60/40, in view of the heat resistance of the polyamide (A).

The above diamine unit may comprise diamine units other than the aliphatic diamine unit having 4 to 18 carbon atoms. Examples of the other diamine units include units derived from aliphatic diamines such as ethylenediamine, 1,2-propanediamine and 1,3-propanediamine; alicyclic diamines such as cyclohexanediamine, methylcyclohexanediamine, isophoronediamine, norbornanedimethylamine and tricyclodecanedimethylamine; aromatic diamines such as p-phenylenediamine, m-phenylenediamine, p-xylylenediamine, m-xylylenediamine, 4,4'-diaminodiphenylmethane, sulfone and 4,4'-diaminodiphenyl ether; and the like. The other diamine units can comprise one or more units among these. The content of the other diamine units in the diamine unit is preferably 40% by mol or lower, more preferably 25% by mol or lower, and still more preferably 10% by mol or lower.

In the polyamide (A), the molar ratio of the dicarboxylic acid unit and the diamine unit is preferably in the range of 1/0.5 to 1/2, more preferably in the range of 1/0.75 to 1/1.5, and still more preferably in the range of 1/0.8 to 1/1.2.

Further the polyamide (A) may also have an aminocarboxylic acid unit. Examples of the aminocarboxylic acid unit include units derived from lactams such as caprolactam and lauryllactam; and aminocarboxylic acids such as 11-aminoundecanoic acid and 12-aminododecanoic acid. The content of the aminocarboxylic acid unit in the polyamide (A) is preferably 40% by mol or lower, and more preferably 20% by mol or lower, with respect to 100% by mol of the total of the dicarboxylic acid unit and the diamine unit.

The polyamide (A) to be used in the present invention may comprise a unit derived from a terminal capping agent. The unit derived from a terminal capping agent is preferably 1.0 to 10% by mol, more preferably 2.0 to 7.5% by mol, and still more preferably 2.5 to 6.5% by mol, with respect to the diamine unit. When the unit derived from a terminal capping agent is in the above range, the polyamide composition is excellent in the moldability and an obtained reflection plate is better in the light reflectance and the heat resistance.

In order to adjust the amount of the unit derived from a terminal capping agent in the above desired range, the terminal capping agent is used in an amount within the above desired range with respect to the diamines when polymerization raw materials are mixed. Then, in consideration that monomer components are vaporized in polymerization, the amount of a terminal capping agent used upon mixing the polymerization raw materials is desirably adjusted finely so that a desired amount of the unit derived from the terminal capping agent is introduced in an obtained resin.

Examples of methods for determining the amount of the unit derived from a terminal capping agent in the polyamide (A) include a method including measuring the viscosity of a solution, calculating the amount of all terminal groups from the relational expression of the number-average molecular weight therewith, and subtracting the amount of amino groups and amount of carboxyl groups determined by titration from the amount of all the terminal groups, as described in JP 07-228690 A; and a method in which the amount of the unit is determined using $^1$H-NMR based on integration values of respective signals corresponding to the diamine unit and the unit derived from the terminal capping agent.

As the terminal capping agent, there can be used a monofunctional compound having a reactivity with a terminal amino group or a terminal carboxyl group. The terminal capping agent specifically includes monocarboxylic acids, acid anhydrides, monoisocyanates, monoacid halides, monoesters, monoalcohols and monoamines. In view of the reactivity and the stability of capped terminals, a terminal capping agent for terminal amino groups is preferably a monocarboxylic acid; and a terminal capping agent for terminal carboxylic groups is preferably a monoamine. Further in view of easiness in handleability, and the like, the terminal capping agent is more preferably a monocarboxylic acid.

The monocarboxylic acid to be used as the terminal capping agent is not especially limited as long as having a reactivity with an amino group, and examples thereof include aliphatic monocarboxylic acids such as acetic acid, propionic acid, butyric acid, valeric acid, caproic acid, caprylic acid, lauric acid, tridecanoic acid, myristic acid, palmitic acid, stearic acid, pivalic acid and isobutyric acid; alicyclic monocarboxylic acids such as cyclopentanecarboxylic acid and cyclohexanecarboxylic acid; aromatic monocarboxylic acids such as benzoic acid, toluic acid, α-naphthalenecarboxylic acid, β-naphthalenecarboxylic acid, methylnaphthalenecarboxylic acid and phenylacetic acid; and optional mixtures thereof. Among these, in view of the reactivity, the stability of capped terminals, the costs and the like, preferable are acetic acid, propionic acid, butyric acid, valeric acid, caproic acid, caprylic acid, lauric acid, tridecanoic acid, myristic acid, palmitic acid, stearic acid and benzoic acid.

The monoamine to be used as the terminal capping agent is not especially limited as long as having a reactivity with a carboxyl group, and examples thereof include aliphatic monoamines such as methylamine, ethylamine, propylamine, butylamine, hexylamine, octylamine, decylamine, stearylamine, dimethylamine, diethylamine, dipropylamine, and dibutylamine; alicyclic monoamines such as cyclohexylamine and dicyclohexylamine; aromatic monoamines such as aniline, toluidine, diphenylamine and naphthylamine; and optional mixtures thereof. Among these, in view of the reactivity, the high boiling point, the stability of capped terminals, the costs, and the like, preferable are butylamine, hexylamine, octylamine, decylamine, stearylamine, cyclohexylamine and aniline.

The polyamide (A) to be used in the present invention can be produced using any method known as a method for producing crystalline polyamide. The polyamide (A) can be produced by, for example, a solution polymerization method or an interfacial polymerization method using an acid chloride and a diamine as raw materials, or a melt polymerization method, a solid phase polymerization method or a melt extrusion polymerization method using a dicarboxylic acid and a diamine as raw materials.

The polyamide (A) can be produced, for example, by first collectively adding a diamine, a dicarboxylic acid, and as required, a catalyst and a terminal capping agent to produce a nylon salt, thereafter thermally polymerizing the nylon salt at a temperature of 200 to 250° C. to make a prepolymer, and polymerizing the prepolymer by solid phase polymerization or polymerizing it using a melt extruder. In the case where the final stage of the polymerization is carried out by solid phase polymerization, the stage is preferably carried out under reduced pressure or in an inert gas flow; and when the polymerization temperature is in the range of 200 to 280° C., the polymerization rate is high to bring about excellent productivity, and coloration and gelation can effectively be suppressed. The polymerization temperature in the case where the final stage of the polymerization is carried out using a melt extruder is preferably 370° C. or lower; and when the polymerization is carried out under such a condition, almost no decomposition occurs and thus a polyamide (A) exhibiting little deterioration can be obtained.

Examples of the catalyst usable when the polyamide (A) is produced include phosphoric acid, phosphorous acid, hypophosphorous acid, and salts or esters thereof. Examples of the above salts or esters include salts of phosphoric acid, phosphorous acid or hypophosphorous acid with a metal such as potassium, sodium, magnesium, vanadium, calcium, zinc, cobalt, manganese, tin, tungsten, germanium, titanium or antimony; ammonium salts of phosphoric acid, phosphorous acid or hypophosphorous acid; and esters of phosphoric acid, phosphorous acid or hypophosphorous acid, such as an ethyl ester, isopropyl ester, butyl ester, hexyl ester, isodecyl ester, octadecyl ester, decyl ester, stearyl ester and phenyl ester. Among these, sodium hypophosphite monohydrate or phosphorous acid is preferable.

The polyamide (A) has an intrinsic viscosity as measured under the condition of 30° C. in a concentrated sulfuric acid preferably in the range of 0.60 to 1.2 dl/g, and more preferably in the range of 0.65 to 1.1 dl/g. When the polyamide (A) having an intrinsic viscosity of 0.60 dl/g or higher is used, the mechanical properties of an obtained reflection plate become favorable. Further when the polyamide (A) having an intrinsic viscosity of 1.2 dl/g or lower is used, the moldability is favorable.

<Titanium Oxide (B)>

The polyamide composition of the present invention comprises titanium oxide (B) in order to provide an LED reflection plate having a high light reflectance. Examples of the titanium oxide (B) include titanium oxide (TiO), titanium trioxide ($Ti_2O_3$) and titanium dioxide ($TiO_2$). Any thereof may be used, but titanium dioxide is preferable. The titanium dioxide preferably, but not especially limited, has a crystal structure of rutile type or anatase type, and in view of the weather resistance and the light reflectance, titanium dioxide having a crystal structure of rutile type is more preferable. Since the titanium dioxide having a crystal structure of rutile type has a higher refractive index than that of the anatase type, also the difference in refractive index from that of other constituents (media) in the composition becomes large. Since a larger difference in refractive index between the media and the titanium oxide gives a higher reflectance at the interfaces therebetween, the larger difference is advantageous to provide a high light reflectance.

The shape of the titanium oxide (B) is not especially limited, but is preferably amorphous. In the case of using an amorphous titanium oxide (B), the dimensional change and the anisotropy of the dimensional change of an obtained reflection plate are small, thereby exhibiting the effect of preventing deficiencies including debonding from an encapsulating material to be used for LED packages.

The average particle diameter of the titanium oxide (B) is preferably in the range of 0.10 to 0.50 µm, more preferably 0.15 to 0.40 µm, and still more preferably 0.20 to 0.30 µm, in view of providing a sufficient light reflectance. Here, titanium oxide that is massive or has a large average particle diameter may be used after suitably crushing them and classifying the resultant with a sieve or the like as required to the above average particle diameter.

The average particle diameter of the titanium oxide (B) can be determined by an image analysis using an electron microscope method. Specifically, major-axis diameters and minor-axis diameters of 1,000 or more titanium oxide particles photographed using a transmission electron microscope are measured and the average value thereof is taken as an average particle diameter.

Further there may be used the titanium oxide (B) having been subjected to a surface treatment in order to improve the dispersibility in the composition. Examples of a surface-treating agent include metal oxides such as silica, alumina, zirconia, tin oxide, antimony oxide and zinc oxide; organosilicon compounds such as silane coupling agents and silicones; organotitanium compounds such as titanium coupling agents; and organic substances such as organic acids and polyols.

<Magnesium Oxide (C)>

The polyamide composition of the present invention comprises the magnesium oxide (C). Thereby, an LED reflection plate obtained by molding the composition can be suppressed in the color change such as yellowing and the decrease in the whiteness, and particularly, even in the case of being exposed to heat supposed in production steps of LED packages and under the use environment, the LED reflection plate can show a small decrease in the light reflectance to maintain a high light reflectance both after short-time heating and after long-term heating. The reasons therefor are not clear, but are conceivably as follows: the phenolic antioxidant described later traps radicals generated by heat or light, and further peroxides generated is stabilized by the magnesium oxide or decomposed by the phosphorus-containing antioxidant described later, whereby these components can cooperatively and effectively block the radical chain reaction to reduce the color change due to oxidative deterioration. Further the additional reason is conceivably as follows: the magnesium oxide probably has the effect of reacting with sites to become starting points of the thermal color change of the polyamide to thereby suppress the thermal color change, whereby the color change can be suppressed synergistically with the above effect.

The average particle diameter of the magnesium oxide (C) is not especially limited, but is preferably 0.050 to 10 µm, more preferably 0.10 to 5.0 µm, and still more preferably 0.20 to 2.0 µm, in view of improving various properties. The average particle diameter can be measured by the same method as in the above.

Also the specific surface area of the magnesium oxide (C) is not especially limited, but the BET specific surface area is preferably 50 m$^2$/g or larger, and more preferably 50 to 200 m$^2$/g, and still more preferably 90 to 160 m$^2$/g. When the BET specific surface area of the magnesium oxide (C) is 50 m$^2$/g or larger, the dispersibility thereof in the polyamide (A) becomes good to suppress the agglomeration, and an LED reflection plate having a high light reflectance can be thus obtained. Further, also in the case of being exposed to heat supposed in production steps of LED packages and under the use environment, the LED reflection plate can show a small decrease in the light reflectance to maintain a high light reflectance both after short-time heating and after long-term heating, and the mechanical strength of an obtained LED reflection plate is thus improved. The BET specific surface area is a value measured according to JIS Z8830:2013.

Further as the magnesium oxide (C), there may be used one having been subjected to a surface treatment in order to improve the adhesion with the polyamide (A) and the dispersibility. Examples of a surface-treating agent include organosilicon compounds including silane coupling agents such as aminosilanes and epoxysilanes, and silicones; organotitanium compounds such as titanium coupling agents; and organic substances such as organic acids and polyols.

<Phenolic Antioxidant (D)/Phosphorus-Containing Antioxidant (E)>

The polyamide composition of the present invention comprises the phenolic antioxidant (D) and the phosphorus-containing antioxidant (E). In the polyamide composition of the present invention, concurrent use of the phenolic antioxidant (D) and the phosphorus-containing antioxidant (E) can provide an LED reflection plate that has a high light reflectance and can maintain a high light reflectance even after being exposed to heat or light. In the case where the polyamide composition comprises only either one of the phenolic antioxidant (D) and the phosphorus-containing antioxidant (E), or comprises neither, the light reflectance decreases when exposed to heat or light, and thus the decrease in the light reflectance both after short-term heating and after long-term heating cannot be suppressed.

(Phenolic Antioxidant (D))

The polyamide composition of the present invention comprises a predetermined phenolic antioxidant (D), by which radicals generated by heat or light can be trapped to suppress the decrease in the light reflectance of an obtained LED reflection plate.

The phenolic antioxidant (D) to be used in the present invention is characterized in not having 4 or more phenol structures in the molecule in view of exhibiting the above effect. That is, the phenolic antioxidant (D) in the present invention is constituted only of any of phenolic antioxidants having 1 to 3 phenol structures in its molecule. If a phenolic antioxidant having 4 or more phenol structures in its molecule is used in the polyamide composition for an LED reflection plate, the light reflectance after long-term heating decreases.

The above "phenol structure" is preferably a structure represented by the following formula (2).

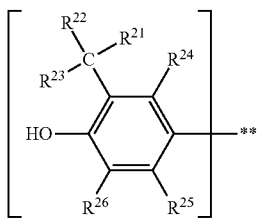

(2)

wherein $R^{21}$ to $R^{23}$ are each independently an alkyl group having 1 or 2 carbon atoms; $R^{24}$ to $R^{26}$ are each independently a hydrogen atom or an alkyl group having 1 to 10 carbon atoms; and ** represents a bonding site.

In view of providing a high light reflectance and in view of suppressing the decrease in the light reflectance, the phenolic antioxidant (D) to be used in the present invention is preferably a phenolic antioxidant having 1 to 3 structures represented by the above formula (2) in its molecule, more preferably a phenolic antioxidant having 2 or 3 thereof, and still more preferably a phenolic antioxidant having 2 thereof.

In the above formula (2), the groups represented by $R^{21}$ to $R^{23}$ are preferably a methyl group, that is, the group represented by —C($R^{21}$)($R^{22}$)($R^{23}$) is preferably a t-butyl group, in view of suppressing the decrease in the light reflectance.

In the above formula (2), the groups represented by $R^{24}$ and $R^{25}$ are preferably a hydrogen atom or an alkyl group having 1 or 2 carbon atoms, and more preferably a hydrogen atom, in view of the stability of phenoxy radicals to be formed after radicals generated by heat or light are trapped.

In the above formula (2), the group represented by $R^{26}$ is preferably an alkyl group having 1 to 7 carbon atoms, more preferably an alkyl group having 1 to 4 carbon atoms, and still more preferably a methyl group or a t-butyl group, in view of suppressing the decrease in the light reflectance.

In the phenolic antioxidant having the structure represented by the above formula (2), preferably, all of the groups represented by $R^{21}$ to $R^{23}$ are a methyl group and the group represented by $R^{26}$ is a methyl group or a t-butyl group, in view of providing a high light reflectance and in view of suppressing the decrease in the light reflectance; and specifically, a phenolic antioxidant represented by the following formula (3) is more preferable.

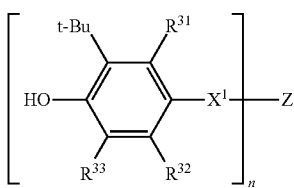

(3)

wherein $R^{31}$ and $R^{32}$ each independently represent a hydrogen atom or a methyl group; $R^{33}$ represents a methyl group or a t-butyl group; $X^1$ represents a divalent organic group having 1 to 20 carbon atoms; Z represents a mono- to trivalent organic group; and n is an integer of 1 to 3.

In the above formula (3), the groups represented by $R^{31}$ and $R^{32}$ are preferably a hydrogen atom in view of the stability of phenoxy radicals formed after radicals generated by heat or light are trapped; and the group represented by $X^1$ is preferably a divalent organic group represented by the following formula (4) in view of improving the light reflectance and suppressing the decrease in the light reflectance.

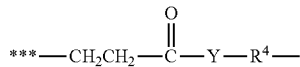

(4)

wherein $R^4$ represents a single bond or an alkylene group having 1 to 17 carbon atoms; Y represents an oxygen atom or a group represented by —NH—; and *** represents a bonding site with a phenol structure.

In a phenolic antioxidant represented by the above formula (3), in the case where n is 1, Z is a monovalent organic group and the phenolic antioxidant is a monofunctional phenolic antioxidant having a t-butyl group at an ortho-position to the phenolic hydroxyl group (hereinafter, referred to also as "monofunctional phenolic antioxidant).

In the monofunctional phenolic antioxidant to be used in the present invention, Y of the above formula (4) is preferably an oxygen atom and $R^4$ is preferably a single bond, in view of improving the light reflectance and suppressing the decrease in the light reflectance. Further Z of the above formula (3) is preferably an alkyl group having 5 to 25 carbon atoms, more preferably an alkyl group having 10 to 20 carbon atoms, still more preferably an alkyl group having 15 to 20 carbon atoms, and further still more preferably an n-octadecyl group.

The monofunctional phenolic antioxidant includes n-octadecyl-3-(3,5-di-t-butyl-4-hydroxyphenyl)propionate. Examples of commercially available products thereof include "Adekastab AO-50" (trade name, manufactured by Adeka Corp.) and "IRGANOX 1076" (trade name, manufactured by BASF Japan Co., Ltd.).

In a phenolic antioxidant represented by the above formula (3), in the case where n is 2, Z is a divalent organic group and the phenolic antioxidant is a bifunctional phenolic antioxidant having a t-butyl group at an ortho-position to the phenolic hydroxyl groups each (hereinafter, referred to also as "bifunctional phenolic antioxidant).

In the bifunctional phenolic antioxidant to be used in the present invention, $R^4$ is preferably a single bond.

In the case where Y of the above formula (4) is a group represented by —NH—, in view of improving the light reflectance and suppressing the decrease in the light reflectance, Z of the above formula (3) is preferably an alkylene group having 1 to 10 carbon atoms, more preferably an alkylene group having 4 to 8 carbon atoms, and still more preferably an alkylene group having 6 carbon atoms.

In the case where Y of the above formula (4) is an oxygen atom, in view of improving the light reflectance and suppressing the decrease in the light reflectance, Z of the above formula (3) is preferably one or more selected from the group consisting of straight-chain or branched-chain alkylene groups having 1 to 10 carbon atoms, ether groups represented by —$X^2$—O—$X^2$—, thioether groups represented by —$X^2$—S—$X^2$— and divalent organic groups represented by the following formula (5) and having a Spiro skeleton derived from pentaerythritol in the molecule, more preferably one or more selected from the group consisting of thioether groups represented by —$X^2$—S—$X^2$— and divalent organic groups represented by the following formula (5) and having a spiro skeleton derived from pentaerythritol in the molecule, and still more preferably a divalent organic group represented by the following formula (5) and having a Spiro skeleton derived from pentaerythritol in the molecule.

$X^2$ of the formula (5) is preferably a straight-chain or branched-chain alkylene group having 1 to 7 carbon atoms, more preferably a straight-chain or branched-chain alkylene group having 2 to 4 carbon atoms, and still more preferably a branched butylene group, having 4 carbon atoms. That is, the formula (5) is preferably represented by the following formula (5').

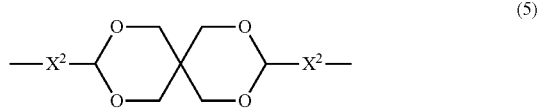

(5)

wherein $X^2$ represents a straight-chain or branched-chain alkylene group having 1 to 10 carbon atoms.

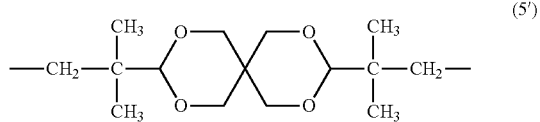

(5')

The bifunctional phenolic antioxidant includes 2,2-thiodiethylenebis[(3-(3,5-di-t-butyl-4-hydroxyphenyl)propionate], N,N'-hexamethylenebis[(3-(3,5-di-t-butyl-4-hydroxyphenyl)propionamide)], triethylene glycol bis(3-t-butyl-4-hydroxy-5-methylphenyl)propionate, hexamethylenebis(3-(3,5-di-t-butyl-4-hydroxyphenyl)propionate), and 3,9-bis[1,1-dimethyl-2-[β-(3-t-butyl-4-hydroxy-5-methylphenyl)propionyloxy]ethyl]-2,4,8,10-tetraoxaspiro[5.5]undecane. Examples of commercially available products thereof include "IRGANOX 1035", "IRGANOX 1098", "IRGANOX 245" and "IRGANOX 259" (trade names, manufactured by BASF Japan Co., Ltd.), "Adekastab AO-80" (trade name, manufactured by Adeka Corp.), and "Sumilizer GA-80" (trade name, manufactured by Sumitomo Chemical Co., Ltd.).

In a phenolic antioxidant represented by the above formula (3), in the case where n is 3, Z is a trivalent organic group and the phenolic antioxidant is a trifunctional phenolic antioxidant having a t-butyl group at an ortho-position to the phenolic hydroxyl groups each (hereinafter, referred to also as "trifunctional phenolic antioxidant).

The trifunctional phenolic antioxidant includes tris(3,5-di-t-butyl-4-hydroxybenzyl) isocyanurate and 1,3,5-trimethyl-2,4,6-tris(3,5-di-t-butyl-4-hydroxybenzyl)benzene. Examples of commercially available products thereof include "Adekastab AO-20" (trade name, manufactured by Adeka Corp.).

Among the above, in view of exhibiting the effect of the present invention, the phenolic antioxidant (D) is preferably at least one selected from the group consisting of N,N'-hexamethylenebis[3-(3,5-di-t-butyl-4-hydroxyphenyl)propionamide] (IRGANOX 1098) and 3,9-bis[1,1-dimethyl-2-[β-(3-t-butyl-4-hydroxy-5-methylphenyl)propionyloxy]ethyl]-2,4,8,10-tetraoxaspiro[5.5]undecane (Sumilizer GA-80), and more preferably N,N'-hexamethylenebis[(3-(3,5-di-t-butyl-4-hydroxyphenyl)propionamide].

(Phosphorus-Containing Antioxidant (E))

The polyamide composition of the present invention comprises a predetermined phosphorus-containing antioxidant (E), by which peroxides generated by heat or light can be decomposed to suppress the decrease in the light reflectance of an obtained reflection plate.

The phosphorus-containing antioxidant (E) has 3 or more structures represented by the following formula (1) in its molecule in view of exhibiting the effect of the present invention. Preferable is, particularly at least one selected from the group consisting of phosphite esters and phosphonite esters having 3 or more structures represented by the following formula (1) in the molecules.

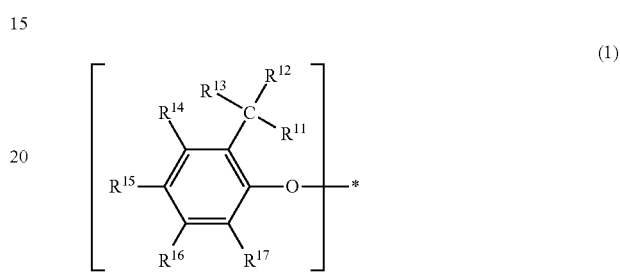

(1)

wherein $R^{11}$ to $R^{13}$ are each independently an alkyl group having 1 or 2 carbon atoms; and $R^{14}$ to $R^{17}$ are each independently a hydrogen atom or an alkyl group having 1 to 10 carbon atoms; and * represents a bonding site with a phosphorus atom.

In the above formula (1), the groups represented by $R^{11}$ to $R^{13}$ are preferably a methyl group, that is, the group represented by $-C(R^{11})(R^{12})(R^{13})$ is preferably a t-butyl group, in view of suppressing the decrease in the light reflectance.

In the above formula (1), the group represented by $R^{15}$ is preferably a secondary or tertiary alkyl group having 3 to 7 carbon atoms, more preferably a tertiary alkyl group having 4 or 5 carbon atoms, and still more preferably a t-butyl group.

In the above formula (1), the groups represented by $R^{14}$ and $R^{16}$ are each independently preferably a hydrogen atom or an alkyl group having 1 or 2 carbon atoms, and more preferably a hydrogen atom, in view of lowering the steric hindrance and improving the reactivity with peroxides generated by heat or light.

In the above formula (1), the group represented by $R^{17}$ is preferably a hydrogen atom or an alkyl group having 1 to 7 carbon atoms, and more preferably a hydrogen atom, in view of lowering the steric hindrance and improving the reactivity with peroxides generated by heat or light.

The phosphorus-containing antioxidant (E) is more preferably at least one selected from the group consisting of phosphorus-containing antioxidants represented by the following general formulae (6) and (7) in view of suppressing the decrease in the light reflectance.

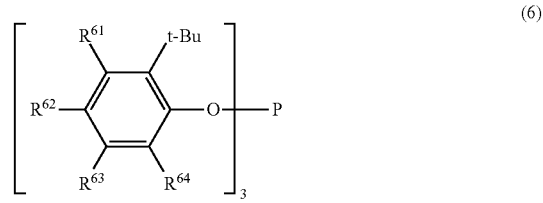

(6)

wherein $R^{61}$, $R^{63}$ and $R^{64}$ are each independently a hydrogen atom or a methyl group; and $R^{62}$ is an alkyl group having 1 to 10 carbon atoms.

In the above formula (6), the group represented by $R^{62}$ is preferably a secondary or tertiary alkyl group having 3 to 7 carbon atoms, more preferably a tertiary alkyl group having 4 or 5 carbon atoms, and still more preferably a t-butyl group.

In the formula (6), the groups represented by $R^{61}$, $R^{63}$ and $R^{64}$ are preferably a hydrogen atom in view of lowering the steric hindrance and improving the reactivity with peroxides generated by heat or light.

A phosphorus-containing antioxidant represented by the above formula (6) is preferably tris(2,4-di-t-butylphenyl) phosphite. Examples of commercially available products thereof include "IRGAFOS 168" (trade name, manufactured by BASF Japan Co., Ltd.).

bination of at least one phenolic antioxidant (D) selected from the group consisting of N,N'-hexamethylenebis(3,5-di-t-butyl-4-hydroxyphenylpropionamide) (IRGANOX 1098) and 3,9-bis[1,1-dimethyl-2-[β-(3-t-butyl-4-hydroxy-5-methylphenyl)propionyloxy]ethyl]-2,4,8,10-tetraoxaspiro [5.5]undecane (Sumilizer GA-80) and at least one phosphorus-containing antioxidant (E) selected from the group consisting of tris(2,4-di-t-butylphenyl) phosphite (IRGAFOS 168) and tetrakis(2,4-di-t-butylphenyl)-4,4'-biphenylene phosphonite (Hostanox P-EPQ), and more preferably a combination of N,N'-hexamethylenebis(3,5-di-t-butyl-4-hydroxyphenylpropionamide) and tris(2,4-di-t-butylphenyl) phosphite.

<Reinforcing Material (F)>

The polyamide composition of the present invention may further comprise a reinforcing material (F) in view of improving the moldability and the mechanical properties.

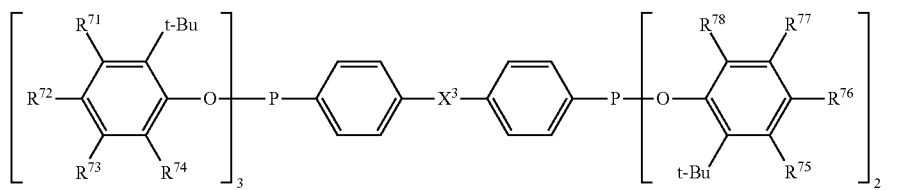

(7)

wherein $R^{71}$, $R^{73}$, $R^{74}$, $R^{75}$, $R^{77}$ and $R^{78}$ each independently represent a hydrogen atom or a methyl group; $R^{72}$ and $R^{76}$ each independently represent an alkyl group having 1 to 10 carbon atoms; and $X^3$ represents a single bond, —O—, —S—, —SO$_2$— or a divalent organic group having 1 to 10 carbon atoms.

In the above formula (7), the groups represented by $R^{72}$ and $R^{76}$ are preferably a secondary or tertiary alkyl group having 3 to 7 carbon atoms, more preferably a tertiary alkyl group having 4 or 5 carbon atoms, and still more preferably a t-butyl group.

In the above formula (7), the groups represented by $R^{71}$, $R^{73}$, $R^{74}$, $R^{75}$, $R^{77}$ and $R^{78}$ are preferably a hydrogen atom.

In the above formula (7), $X^3$ is preferably a single bond.

A phosphorus-containing antioxidant represented by the above formula (7) includes tetrakis(2,4-di-t-butylphenyl)-4,4'-biphenylene phosphonite and tetrakis(2,4-di-t-butyl-5-methylphenyl)-4,4'-biphenylene phosphonite, and in view of improving the light reflectance and suppressing the decrease in the light reflectance, tetrakis(2,4-di-t-butylphenyl)-4,4'-biphenylene phosphonite is preferable.

Examples of commercially available products thereof include "Hostanox P-EPQ" (trade name, manufactured by Clariant Japan K.K.) and "GSY-P101" (trade name, manufactured by Sakai Chemical Industry Co., Ltd.).

These phosphorus-containing antioxidants can be used singly or in a combination of two or more.

In view of suppressing the decrease in the light reflectance, the phosphorus-containing antioxidant (E) is preferably at least one selected from the group consisting of tris(2,4-di-t-butylphenyl) phosphite (IRGAFOS 168) and tetrakis(2,4-di-t-butylphenyl)-4,4'-biphenylene phosphonite (Hostanox P-EPQ), and tris(2,4-di-t-butylphenyl) phosphite is more preferable.

In view of improving the light reflectance and suppressing the decrease in the light reflectance due to heat or light, a suitable combination of the phenolic antioxidant (D) and the phosphorus-containing antioxidant (E) is preferably a com- As the reinforcing material (F), there can be used ones having various forms such as fibrous, plate, needle, powdery and cloth forms. The reinforcing material specifically includes fibrous-form fillers such as glass fibers, carbon fibers, aramid fibers, liquid crystal polymer (LCP) fibers and metal fibers; plate-form fillers such as mica; needle-form fillers such as potassium titanate whiskers, aluminum borate whiskers, calcium carbonate whiskers, magnesium sulfate whiskers, wollastonite, sepiolite, xonotlite and zinc oxide whiskers; and powdery-form fillers such as silica, alumina, barium carbonate, magnesium carbonate, aluminum nitride, boron nitride, potassium titanate, aluminum silicate (kaolin, clay, pyrophyllite, bentonite), calcium silicate, magnesium silicate (attapulgite), aluminum borate, calcium sulfate, barium sulfate, magnesium sulfate, asbestos, glass beads, graphite, carbon nanotubes, silicon carbide, sericite, hydrotalcite, molybdenum disulfide, phenol resin particles, crosslinked styrenic resin particles and crosslinked acrylic resin particles. These reinforcing materials may be used singly or in combination.

For the purpose of enhancing the dispersibility in the polyamide (A) or for the purpose of enhancing the adhesion with the polyamide (A), the surface of these reinforcing materials (F) may be subjected to a surface treatment with a silane coupling agent, a titanium coupling agent, a polymer compound such as an acryl resin, a urethane resin or an epoxy resin, or other low-molecular compounds.

Among the above reinforcing materials (F), the reinforcing material (F) is preferably at least one selected from the group consisting of fibrous-form fillers and needle-form fillers because they can provide molded products high in the mechanical strength. The reinforcing material (F) is preferably glass fibers in view of the high strength and the low cost, and preferably needle-form fillers in view of providing molded products high in the surface smoothness. Particularly, in view of holding the whiteness, there can be preferably used as the reinforcing material (F) at least one selected from the group consisting of glass fibers, wollastonite, potassium titanate whiskers, calcium carbonate whiskers and aluminum borate whiskers, and there can be more preferably used at least one selected from the group consisting of glass fibers and wollastonite.

The average fiber length of the glass fibers is preferably 1 to 10 mm, more preferably 1 to 7 mm, and still more preferably 2 to 4 mm. Further the average fiber diameter of the glass fibers is preferably 6 to 20 μm, and more preferably 6 to 15 μm, in view of providing the mechanical strength.

The average aspect ratio of the wollastonite is preferably 3 or higher, more preferably 5 or higher, and still more preferably 10 or higher, in view of providing the mechanical strength. Further the average fiber diameter of the wollastonite is preferably 0.1 to 15 μm, and more preferably 2.0 to 7.0 μm.

The average fiber length, the average fiber diameter and the average aspect ratio can be determined by the image analysis using an electron microscope method in the same as the above-mentioned measurement method of the average particle diameter of the titanium oxide (B).

<Light Stabilizer (G)>

The polyamide composition of the present invention may further comprise a light stabilizer (G), for the purpose of preventing color change when being exposed to heat and light supposed in production steps of LED packages and under the use environment to suppress the decrease in the light reflectance.

The light stabilizer (G) includes compounds having the ultraviolet absorbing effect such as benzophenone-based compounds, salicylate-based compounds, benzotriazole-based compounds, acrylonitrile-based compounds and other conjugated compounds, and compounds having the radical trapping capability such as hindered amine-containing compounds. Particularly, the light stabilizer (G) is preferably a compound having an amide bond in its molecule in view of high affinity for the polyamide (A) and excellent heat resistance. Further since concurrent use of a compound having an ultraviolet absorbing effect and a compound having a radical trapping capability develops a higher stabilizing effect, it is preferable. These light stabilizers may be used in combination.

A crystal nucleating agent may be incorporated in the polyamide composition of the present invention. The crystal nucleating agent includes talc and carbon black. The average particle diameter of the talc is preferably 1 to 10 μm. The average particle diameter can be measured by the same method as in the above. The amount of the crystal nucleating agent incorporated is, with respect to the mass of the whole polyamide composition, preferably 0.05 to 1.0% by mass.

A compound having a long-chain aliphatic hydrocarbon structure as a release agent may be incorporated in the polyamide composition of the present invention. Specific examples of the release agent include metal salts and esters of higher fatty acids such as stearic acid and montanic acid with calcium or the like, polyethylene waxes and polypropylene waxes.

In the polyamide composition of the present invention, other components such as nigrosine or other organic or inorganic colorants, antistatic agents, plasticizers and lubricants can also be incorporated. In the case where the other components are incorporated in the polyamide composition of the present invention, the amount thereof is preferably 5% by mass or lower with respect to the mass of the whole polyamide composition of the present invention.

<Content of the Each Component in the Polyamide Composition>

The content of the polyamide (A) in the polyamide composition of the present invention is preferably 30% by mass or higher, more preferably 35% by mass or higher, and still more preferably 40% by mass or higher. When the content of the polyamide (A) is 30% by mass or higher, molding into an LED reflection plate is easy, and the heat resistance and the mechanical properties of the obtained LED reflection plate are favorable. Further the content of the polyamide (A) in the polyamide composition of the present invention is preferably 80% by mass or lower, more preferably 70% by mass or lower, and still more preferably 60% by mass or lower, in view of mechanical properties and the high reflectance property of an obtained reflection plate.

The content of the titanium oxide (B) in the polyamide composition of the present invention is 10 to 100 parts by mass, preferably 20 to 92.5 parts by mass, more preferably 30 to 85 parts by mass, and still more preferably 50 to 85 parts by mass, with respect to 100 parts by mass of the polyamide (A). When the content of the titanium oxide (B) in the polyamide composition is lower than 10 parts by mass with respect to 100 parts by mass of the polyamide (A), an LED reflection plate obtained from the composition cannot provide a sufficient light reflectance. Further when the content of the titanium oxide (B) in the polyamide composition exceeds 100 parts by mass with respect to 100 parts by mass of the polyamide (A), an LED reflection plate obtained decreases in the light reflectance and also becomes inferior in the heat resistance and the mechanical properties.

The content of the magnesium oxide (C) in the polyamide composition of the present invention is 0.50 to 15.0 parts by mass, preferably 0.60 to 10.0 parts by mass, and more preferably 0.80 to 5.0 parts by mass, with respect to 100 parts by mass of the polyamide (A). When the content of the magnesium oxide (C) in the polyamide composition is lower than 0.50 part by mass with respect to 100 parts by mass of the polyamide (A), the above-mentioned thermal color change cannot be suppressed. Further when the content of the magnesium oxide (C) in the polyamide composition exceeds 15.0 parts by mass with respect to 100 parts by mass of the polyamide (A), the moldability decreases.

The content of the phenolic antioxidant (D) in the polyamide composition of the present invention is 0.10 to 0.80 part by mass, preferably 0.10 to 0.70 part by mass, and more preferably 0.13 to 0.60 part by mass, with respect to 100 parts by mass of the polyamide (A). When the content of the phenolic antioxidant (D) in the polyamide composition is lower than 0.10 part by mass with respect to 100 parts by mass of the polyamide (A), the light reflectance on being exposed to heat or light decreases. Further when the content of the phenolic antioxidant (D) in the polyamide composition exceeds 0.80 part by mass with respect to 100 parts by mass of the polyamide (A), the light reflectance after long-term heating decreases.

Further in view of exhibiting the effect of the present invention, the mass ratio [(D) component/(E) component] of the phenolic antioxidant (D) to the phosphorus-containing antioxidant (E) in the polyamide composition of the present invention satisfies the following expression (I).

$$0.25 \leq \text{mass ratio } [(D) \text{ component}/(E) \text{ component}] \leq 3.0 \tag{I}$$

When the mass ratio is lower than 0.25, the light reflectance particularly after short-term heating decreases; and when exceeding 3.0, the light reflectance particularly after long-term heating decreases.

From the above viewpoint, the mass ratio [(D) component/(E) component] is preferably 0.30 or higher, more preferably 0.50 or higher, and still more preferably 0.80 or higher, and preferably 2.5 or lower, more preferably 2.0 or lower, still more preferably 1.5 or lower, further still more preferably 1.3 or lower, and further still more preferably 1.2 or lower.

Here, the total content of the phenolic antioxidant (D) and the phosphorus-containing antioxidant (E) in the polyamide composition of the present invention is preferably 1.5 parts by mass or lower, and more preferably 1.0 part by mass or lower, with respect to 100 parts by mass of the polyamide (A). When the total content is 1.5 parts by mass or lower, the amount of gases generated in molding of the polyamide composition is small, and therefore there can be avoided deficiencies such as the occurrence of gas burning due to gas residue generated on the molded product surface and the color change during the heating time and the light treatment time.

Here, the mass ratio [(C) component/(E) component] of the magnesium oxide (C) to the phosphorus-containing antioxidant (E) in the polyamide composition of the present invention is preferably 1.0 or higher, and more preferably 4.0 or higher, and preferably 100 or lower, more preferably 60 or lower, still more preferably 50 or lower, and further still more preferably 30 or lower, in view of more suppressing the decrease in the light reflectance both after short-term heating and after long-term heating.

In the case of incorporating the reinforcing material (F), the amount thereof incorporated is preferably 5 to 80 parts by mass, more preferably 10 to 60 parts by mass, and still more preferably 15 to 40 parts by mass, with respect to 100 parts by mass of the polyamide (A) in the polyamide composition of the present invention, in view of properly enhancing the moldability and the mechanical properties. Further in view of exhibiting the effect of the present invention, the amount of the reinforcing material (F) incorporated is preferably in the range of 80% by mass or lower, more preferably in the range of 60% by mass or lower, still more preferably in the range of 40% by mass or lower, and further still more preferably in the range of 30% by mass or lower, with respect to the mass of the whole polyamide composition of the present invention.

In the case of incorporating the light stabilizer (G), the amount thereof incorporated is preferably 0.05 to 2.0 parts by mass, more preferably 0.05 to 1.5 parts by mass, and still more preferably 0.10 to 1.0 part by mass, with respect to 100 parts by mass of the polyamide (A) in the polyamide composition of the present invention, in consideration of the effect of preventing the color change of the polyamide composition of the present invention and suppressing the decrease in the light reflectance thereof, and also in view of not excessively raising the production cost.

The polyamide composition of the present invention can be prepared by mixing the above-mentioned constituents by a known method. Examples of the method include a method in which each component is added during the polycondensation reaction of the polyamide (A), a method in which the polyamide (A) and the other components are dry blended, and a method in which the constituents are melt kneaded by using an extruder. Among these, the method in which the constituents are melt kneaded by using an extruder is preferable because of easiness in the operation, the capability of obtaining a homogeneous composition, and the like. The extruder to be used at this time is preferably a twin-screw type one, and the melt kneading temperature is preferably a temperature in the range from a temperature higher by 5° C. than the melting point of the polyamide (A) to 370° C. inclusive.

The polyamide composition of the present invention is favorable in moldability, and can be molded into LED reflection plates by a molding method usually used for thermoplastic resin compositions, such as injection molding, extrusion molding, press molding, blow molding, calender molding or cast molding. A molding method in combination of the above molding methods can also be employed. Injection molding is preferable particularly in aspects of easiness in molding, mass production, costs and the like. Further, the polyamide composition of the present invention and other polymers can also be composite molded. Further, the polyamide composition of the present invention can also be composited with a molding body of a metal, a fabric or the like.

[LED Reflection Plate]

The LED reflection plate of the present invention is obtained by molding the above-mentioned polyamide composition of the present invention. Even in the case of being exposed to heat supposed in production steps of LED packages and under the use environment, the reflection plate can show a small decrease in the light reflectance to maintain a high reflectance both after short-time heating and after long-term heating.

The LED reflection plate of the present invention can suitably be used as LED reflection plates to be used, for example, for backlight sources, illuminations and various types of lamps for cars. The LED reflection plate can suitably be used particularly as reflection plates for LEDs ready for surface mounting.

The LED reflection plate of the present invention is characterized in holding the reflectance of light of a wavelength of 460 nm by a spectrophotometer at high levels both after short-term heating and after long-term heating. For example, in the case where the content of the titanium oxide (B) is 56.6 parts by mass with respect to 100 parts by mass of the polyamide (A), the decrease in the reflectance from the initial reflectance through heating at 170° C. for 5 hours is preferably 8.0% or smaller, more preferably 7.5% or smaller, and still more preferably 7.0% or smaller. Further, the decrease in the reflectance from the initial reflectance through heating at 120° C. for 1,000 hours is preferably 14% or smaller, more preferably 13% or smaller, and still more preferably 12% or smaller.

Further the LED reflection plate of the present invention holds the reflectance of light of a wavelength of 460 nm by a spectrophotometer at a high level also after light irradiation. For example, in the case where the content of the titanium oxide (B) and the content of the light stabilizer (G) are 56.6 parts by mass and 0.57 part by mass, respectively, with respect to 100 parts by mass of the polyamide (A), the decrease in the reflectance from the initial reflectance through irradiation of ultraviolet rays for 240 hours is preferably 3.0% or smaller, more preferably 2.5% or smaller, and still more preferably 2.0% or smaller.

The initial reflectance of light of a wavelength of 460 nm by a spectrophotometer of the LED reflection plate of the present invention is preferably 93.0% or higher, more preferably 95.0% or higher, and still more preferably 96.0% or higher.

Here, the each light reflectance by a spectrophotometer, and the decrease in the each reflectance can be measured by a method described in Examples.

The LED reflection plate of the present invention can be used for a light-emitting device, and the light-emitting device comes to have a long life.

[Light-Emitting Device]

The light-emitting device of the present invention comprises the above-mentioned LED reflection plate of the present invention. Specific examples of the light-emitting device of the present invention include backlight sources, light sources for illumination and light sources for various types of lamps for cars.

FIG. 1 illustrates one example of a typical constitution of the light-emitting device of the present invention. FIG. 1 is a schematically illustrated light-emitting device (LED device) 1 of SMD (surface mounted device) type. In the light-emitting device 1, a semiconductor light-emitting element 10 is disposed in a package-form section 50 formed of a substrate 20 and a reflector (housing) 30, and an encapsulating member 40 (light-transmissive resin) is filled in the package-form section 50.

Hereinafter, each element of the light-emitting device of the present invention will be described. The light-emitting device of the present invention is not limited by the following elements.

<Semiconductor Light-Emitting Element>

As the semiconductor light-emitting element 10, one having a light-emission peak wavelength in the wavelength region of 500 nm or shorter is suitably usable. The semiconductor light-emitting element usable is not limited to one having a single light-emission peak, and one having a plurality of light-emission peaks can be also usable. Here, in the case of having a plurality of light-emission peaks, the semiconductor light-emitting element may have one or more light-emission peaks in a wavelength region longer than 500 nm. There can further be used a semiconductor light-emitting element having a light-emission peak in the long wavelength region (501 nm to 780 nm) of visible light.

The constitution of the semiconductor light-emitting element 10 is not especially limited as long as having the above wavelength property. There can be used one having a semiconductor of, for example, GaAlN, ZnS, ZnSe, SiC, GaP, GaAlAs, AlN, InN, AlInGaP, InGaN, GaN or AlInGaN, formed as a light-emitting layer.

Further the light-emitting layer may comprise an optional dopant.

As the semiconductor light-emitting element 10, a plurality of semiconductor light-emitting elements can be used appropriately. The semiconductor light-emitting element may be composed of, for example, two light-emitting elements capable of emitting green light, one light-emitting element capable of emitting blue light and one light-emitting element capable of emitting red light.

A connection method of the semiconductor light-emitting element 10 to the substrate 20 is not especially limited, and a conductive epoxy or silicone adhesive can be used. Further in order to efficiently conduct heat generated by the semiconductor element to the substrate, a low-melting point metal can be used. Examples thereof include Sn/Ag/Cu (melting point: 220° C.) and Sn/Au (melting point: 282° C.).

<Package>

A package is a member on which the semiconductor light-emitting element 10 is mounted, and a part or the whole thereof is formed of the above-mentioned LED reflection plate of the present invention. The package may be composed of a single member or may be constituted by combining a plurality of members.

The package preferably has a recess portion (cup-shaped portion). One example of the package is a combination of a reflector (housing) and a substrate; for example, in FIG. 1, a package is constituted by adhering the reflector (housing) 30 of a desired shape on the substrate 20 so that a recess portion (cup-shaped portion) is formed. The substrate 20 and the reflector 30 are formed of the LED reflection plates of the present invention molded of the above-mentioned polyamide composition. Only one of the substrate 20 and the reflector 30 may be formed of the LED reflection plate of the present invention. In the case of thus using a plurality of the LED reflection plates of the present invention, there may be used a combination of the LED reflection plates having different properties obtained by forming the LED reflection plates by varying the composition of the polyamide composition. Another example is a constitution in which the above-mentioned polyamide composition is molded so as to form a recess portion (cup-shaped portion) on one surface side thereof to thereby form the package as one LED reflection plate. As still another example, there can also be used a package composed only of a plate-form LED reflection plate.

The recess portion (cup-shaped portion) formed in the package refers to a portion composed of a space having a shape which has the bottom part and the side surface part, and whose area of the cross-section in the direction perpendicular to the optical axis continuously or stepwise increases from the bottom part toward the side on which light is emitted from the light-emitting device. The shapes of the bottom part and the side surface part are not especially limited as long as satisfying such a condition.

<Encapsulating Member>

The encapsulating member 40 is a member formed so as to cover the semiconductor light-emitting element 10, and is provided for the purpose of protecting the semiconductor light-emitting element 10 mainly from the outside environment.

For the encapsulating member 40, a transparent thermosetting resin can be used for the purpose of protecting the semiconductor light-emitting element 10 and interconnects. Examples of the transparent thermosetting resin include thermosetting resins including epoxies and silicones. With respect to the silicones, any of resin types, rubber types and gel types can be used according to required properties of the package. Further in order to enhance the adhesion of the reflector 30 with the encapsulating member 40, the reflector 30 can be treated with a rare gas plasma of argon gas or the like.

The encapsulating member 40 can also be provided so that a plurality of layers composed of different materials are laminated and formed on the semiconductor light-emitting element 10.

The encapsulating member 40 can also comprise a fluorescent substance. Use of the fluorescent substance enables part of light from the semiconductor light-emitting element 10 to be converted to light having a different wavelength, and can thus change or adjust the emission color of the light-emitting device.

Any fluorescent substance can be used as long as it can be excited by light from the semiconductor light-emitting element 10. There is preferably used at least one selected from the group consisting of, for example, nitride fluorescent substances, oxynitride-based fluorescent substances and sialon-based fluorescent substances activated mainly with a lanthanoid series element such as Eu or Ce; alkaline earth metal aluminate fluorescent substances, alkaline earth silicates, alkaline earth sulfides, alkaline earth thioagallates, alkaline earth silicon nitrides and germanate salts activated mainly with a lanthanoid series element such as Eu or a transition metal element such as Mn; and rare earth aluminates and rare earth silicates activated mainly with a lanthanoid series element such as Ce and organic compounds and organic complexes activated mainly with a lanthanoid series element such as Eu.

The encapsulating member 40 can also comprise a combination of a plurality of fluorescent substances. In this case, there can also be used a combination of a fluorescent substance emitting light by being excited by light from the semiconductor light-emitting element 10 and another fluorescent substance emitting light by being excited by light from the former fluorescent substance.

The encapsulating member 40 may comprise a light diffusion material such as titanium dioxide or zinc oxide to promote the diffusion of light inside the encapsulating member 40 to thereby reduce light-emission unevenness.

The light-emitting device of FIG. 1 is manufactured, for example, as follows. First, an LED reflection plate of the present invention as a reflector 30 is disposed on another LED reflection plate of the present invention as a substrate 20. Then, a semiconductor light-emitting element 10 is mounted, and electrodes of the semiconductor light-emitting element 10 and an interconnect pattern on the substrate 20 are connected through leads. Then, a liquid silicone encapsulating agent composed of a main agent and a curing agent is provided, and potted in a cup-shaped portion. The resultant is heated to about 150° C. in this state to thereby thermally cure the silicone encapsulating agent. Thereafter, the resultant is allowed to dissipate heat in air.

Figure 2:
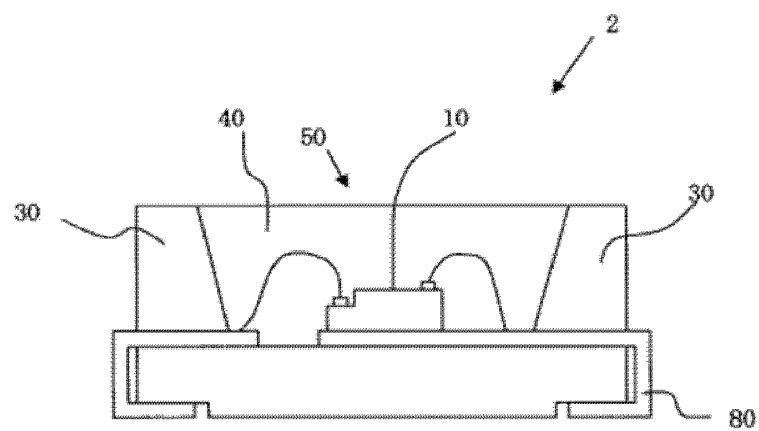
FIG. 2 is a view schematically illustrating one example of a constitution of the light-emitting device of to the present invention.

FIG. 2 illustrates a schematic view of a light-emitting device 2 of the present invention having another constitution. In FIG. 2, the same elements as in the light-emitting device 1 are given the same reference signs. In the light-emitting device 2, a lead frame 80 is used in place of the substrate, and a semiconductor light-emitting element 10 is mounted on the lead frame 80. The other constitution is the same as in the light-emitting device 1.

Figure 3:
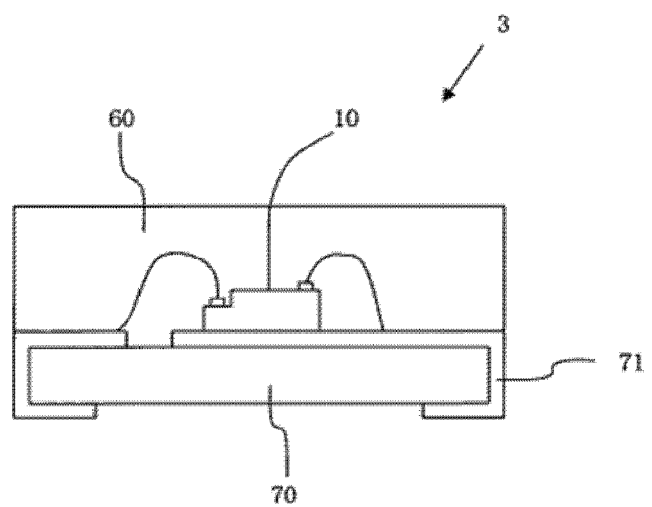
FIG. 3 is a view schematically illustrating one example of a constitution of the light-emitting device of to the present invention.

FIG. 3 illustrates a schematic view of a light-emitting device 3 of the present invention having still another constitution. In FIG. 3, the same elements as in the light-emitting device 1 are given the same reference signs. In the light-emitting device 3, an LED reflection plate of the present invention as a substrate 70 is used. Desired interconnects 71 are provided on the substrate 70. Further no housing (reflector) is used and as illustrated in the figure, after a semiconductor light-emitting element 10 is mounted, an encapsulating member 60 can be formed by molding using a desired mold. Alternatively, an encapsulating member 60 molded into a desired shape may be previously prepared and then adhered on the substrate 70 so as to cover the semiconductor light-emitting element 10.

Hitherto, there have been described the light-emitting devices of SMD type as constitution examples of the present invention, but the present invention can apply also to so-called shell-type light-emitting diodes, which are made by mounting a light-emitting element on a lead frame having a cup-shaped portion and covering the light-emitting element and a part of the lead frame with an encapsulating member. The present invention can further apply also to light-emitting devices of flip chip type, in which a light-emitting element is mounted in a so-called flip chip form on a substrate or a lead frame.

EXAMPLES

Hereinafter, the present invention will be described in more detail by way of Examples and Comparative Examples, but the present invention is not limited to the following Examples.

Note that each evaluation in Examples and Comparative Examples was performed in accordance with the methods shown below.
(Melting Point)

With respect to the melting point of the polyamide, there was determined, as the melting point (° C.), the peak temperature of the melting peak emerging when the temperature was raised under a nitrogen atmosphere from 30° C. to 360° C. at a rate of 10° C./min by using a differential scanning calorimetric analyzer "DSC 822", manufactured by Mettler Toledo International Inc. Here, in the case where there emerged a plurality of melting peaks, the peak temperature of the melting peak on the highest temperature side was determined as the melting point.
(Intrinsic Viscosity [η])

There were measured inherent viscosities ($\eta_{inh}$) of samples having a concentration of 0.05, 0.1, 0.2 and 0.4 g/dl in concentrated sulfuric acid at 30° C., and a value obtained by extrapolating them to a concentration of 0 was determined as an intrinsic viscosity [η].

$$\eta_{inh}=[\ln(t1/t0)]/c$$

wherein $\eta_{inh}$ represents an inherent viscosity (dl/g); t0 represents a flowing-down time (sec) of a solvent; t1 represents a flowing-down time (sec) of a sample solution; and c represents a concentration (g/dl) of a sample.
(Initial Reflectance)

A polyamide composition obtained in each Example and Comparative Example was used and injection molded (mold temperature: 140° C.) at a cylinder temperature higher by about 20° C. than the melting point of the polyamide; a test piece of 1 mm thick, 40 mm wide and 100 mm long was fabricated; the reflectance at a wavelength of 460 nm of the test piece was determined by a spectrophotometer (U-4000), manufactured by Hitachi, Ltd.
(Decrease in Reflectance Through Short-Term Heating)

A polyamide composition obtained in each Example and Comparative Example was used and injection molded (mold temperature: 140° C.) at a cylinder temperature higher by about 20° C. than the melting point of the polyamide; and a test piece of 1 mm thick, 40 mm wide and 100 mm long was fabricated. The test piece was subjected to a heat treatment at 170° C. in a hot-air dryer for 5 hours. The reflectance at a wavelength of 460 nm of the test piece after the heat treatment was determined by a spectrophotometer (U-4000), manufactured by Hitachi, Ltd.

Decrease in reflectance through short-term heating (%)=(initial reflectance (%))−(reflectance (%) after the heat treatment at 170° C. for 5 hours)

(Decrease in Reflectance Through Long-Term Heating)

A polyamide composition obtained in each Example and Comparative Example was used and injection molded (mold temperature; 140° C.) at a cylinder temperature higher by about 20° C. than the melting point of the polyamide; and a test piece of 1 mm thick, 40 mm wide and 100 mm long was fabricated. The test piece was subjected to a heat treatment at 120° C. in a hot-air dryer for 1,000 hours. The reflectance at a wavelength of 460 nm of the test piece after the heat treatment was determined by a spectrophotometer (U-4000), manufactured by Hitachi, Ltd.

Decrease in reflectance through long-term heating (%)=(initial reflectance (%))−(reflectance (%) after the heat treatment at 120° C. for 1,000 hours)

(Evaluation after the Heating)

The light reflectance after the heating in Examples 1 to 6 and Comparative Examples 1 to 10 each (there was used a polyamide composition in which the content of titanium oxide with respect to 100 parts by mass of the polyamide was 56.6 parts by mass) was judged according to the following criteria.

A: The decrease in reflectance through short-term heating was 7.0% or smaller, and the decrease in reflectance through long-term heating was 12% or smaller.

B: The decrease in reflectance through short-term heating was 7.5% or smaller, and the decrease in reflectance through long-term heating was 13% or smaller (excluding those rated as A).

C: The decrease in reflectance through short-term heating was 8.0% or smaller, and the decrease in reflectance through long-term heating was 14% or smaller (excluding those rated as A or B).

D: Excluding the above.

(Decrease in Reflectance Through Light Irradiation)

A polyamide composition obtained in each Example and Comparative Example was used and injection molded (mold temperature: 140° C.) at a cylinder temperature higher by about 20° C. than the melting point of the polyamide; and a test piece of 1 mm thick, 40 mm wide and 100 mm long was fabricated. The test piece was installed at a distance of 25 cm from an upper part quartz glass surface of a light fastness tester (Super Win Mini, manufactured by Daipla Wintes Co., Ltd.) equipped with a KF-1 filter (manufactured by Daipla Wintes Co., Ltd.), and irradiated with light for 240 hours. The illuminance in wavelengths of 300 to 400 nm at the installation position of the test piece was 10 mW/cm². The reflectance at a wavelength of 460 nm of the test piece after the light irradiation was determined by a spectrophotometer (U-4000), manufactured by Hitachi, Ltd.

Decrease in reflectance through light irradiation (%)=(initial reflectance (%))−(reflectance (%) after the light irradiation for 240 hours)

(Moldability)

Test pieces of 0.5 mm thick and 40 mm wide were fabricated by a bar-flow mold by carrying out injection molding (mold temperature: 140° C.) at a cylinder temperature higher by about 20° C. than the melting point of the polyamide and at an injection pressure of 750 kg. The average value of flow lengths Ln (mm) of five fabricated test pieces was measured to evaluate moldability. A material having a shorter flow length gives a higher defective rate involved in unfilling in actual products.

(L1+L2+L3+L4+L5)/5≥45     A:

45>(L1+L2+L3+L4+L5)/5≥40     B:

Production Example 1 (Production of a Polyamide PA1)

5,111.2 g (29.7 mol) of 1,4-cyclohexanedicarboxylic acid having a cis:trans ratio of 70:30, 4,117.6 g (26.0 mol) of 1,9-nonanediamine, 726.6 g (4.59 mol) of 2-methyl-1,8-octanediamine, 224.2 g (1.84 mol) of benzoic acid as a terminal capping agent, 10 g of sodium hypophosphite monohydrate, and 2.5 L of distilled water were placed in an autoclave of 40 L in internal volume, and the autoclave interior atmosphere was replaced by nitrogen. The internal temperature was raised to 200° C. over 2 hours. At this time, the pressure in the autoclave rose up to 2 MPa. Thereafter, the mixture was allowed to react while the internal temperature was held at 215° C. and steam was gradually removed to hold the pressure at 2 MPa, for 2 hours. Then, the pressure was lowered down to 1.2 MPa over 30 min to thereby obtain a prepolymer. The prepolymer was crushed to a size of 1 mm or smaller, and dried at 120° C. under reduced pressure for 12 hours. The resultant was subjected to a solid phase polymerization under the condition of 230° C. and 13.3 Pa for 10 hours to thereby obtain a polyamide PA1 having a terminal capping agent unit of 4.3% by mol, an intrinsic viscosity [η] (measured in concentrated sulfuric acid at 30° C.) of 0.87 dl/g, and a melting point of 315° C. The polyamide PA1 was then used.

Production Example 2 (Production of a Polyamide PA2)

3,149.3 g (18.3 mol) of 1,4-cyclohexanedicarboxylic acid having a cis:trans ratio of 70:30, 2,674.4 g (18.3 mol) of adipic acid, 4,251.7 g (36.6 mol) of 1,6-hexanediamine, 268.1 g (2.2 mol) of benzoic acid as a terminal capping agent, 10 g of sodium hypophosphite monohydrate, and 2.5 L of distilled water were placed in an autoclave of 40 L in internal volume, and thereafter a polyamide was subjected to a solid phase polymerization by the method described in Production Example 1 to thereby obtain a polyamide PA2 having a terminal capping agent unit of 5.2% by mol, an intrinsic viscosity [η](measured in concentrated sulfuric acid at 30° C.) of 0.88 dl/g, and a melting point of 295° C. The polyamide PA2 was then used.

Examples 1 to 13 and Comparative Examples 1 to 13

A polyamide (A), a titanium oxide (B), a magnesium oxide (C), a phenolic antioxidant (D), a phosphorus-containing antioxidant (E) and other components were dry blended in amounts (parts by mass) indicated in Tables by using a screen sorter. An obtained mixture was melt kneaded and extruded into pellets at a temperature higher by 20° C. than the melting point of the polyamide used by using a twin-screw extruder to thereby prepare a polyamide composition. The obtained polyamide composition was used and test pieces in predetermined shapes were fabricated according to the above-mentioned methods and the various physical properties were evaluated. The results are shown in the following Tables.

TABLE 1

| | | Example | | | | | | Comparative Example | |
|---|---|---|---|---|---|---|---|---|---|
| | | 1 | 2 | 3 | 4 | 5 | 6 | 1 | 2 |
| Polyamide (A) | PA1 | 100 | 100 | 100 | 100 | 100 | 100 | 100 | 100 |
| | PA2 | | | | | | | | |
| Titanium oxide (B) | CR-90 | 56.6 | 56.6 | 56.6 | 56.6 | 56.6 | 56.6 | 56.6 | 56.6 |
| Magnesium oxide (C) | MF-150 | 3.8 | 3.8 | 0.9 | 1.9 | | 11.3 | 3.8 | 3.8 |
| | MF-30 | | | | | 3.8 | | | |

TABLE 1-continued

| | | | | | | | | | |
|---|---|---|---|---|---|---|---|---|---|
| Phenolic antioxidant | GA-80 | | 0.19 | | | | | 0.38 | |
| | IRGANOX1098 | 0.19 | | 0.19 | 0.19 | 0.19 | 0.19 | | 0.38 |
| | IRGANOX1010 | | | | | | | | |
| | Hostanox03 | | | | | | | | |
| Phosphorus-containing antioxidant | IRGAFOS168 | 0.19 | 0.19 | 0.19 | 0.19 | 0.19 | 0.19 | | |
| | PEP36 | | | | | | | | |
| Reinforcing material (F) | Wollastonite | 28.3 | 28.3 | 28.3 | 28.3 | 28.3 | 28.3 | 28.3 | 28.3 |
| Light stabilizer (G) | S-EED | 0.57 | 0.57 | 0.57 | 0.57 | 0.57 | 0.57 | 0.57 | 0.57 |
| Release agent | | 0.57 | 0.57 | 0.57 | 0.57 | 0.57 | 0.57 | 0.57 | 0.57 |
| Nucleating agent | | 0.19 | 0.19 | 0.19 | 0.19 | 0.19 | 0.19 | 0.19 | 0.19 |
| Mass ratio [phenolic antioxidant/phosphorus-containing antioxidant] | | 1.0 | 1.0 | 1.0 | 1.0 | 1.0 | 1.0 | — | — |
| Initial reflectance (%) | | 97.2 | 96.9 | 97.2 | 97.0 | 97.0 | 96.6 | 96.8 | 97.1 |
| Decrease in reflectance through short-term heating (%) | | 5.6 | 5.6 | 6.2 | 5.8 | 7.0 | 5.8 | 5.2 | 4.1 |
| Decrease in reflectance through long-term heating (%) | | 11.8 | 11.2 | 11.8 | 11.2 | 12.0 | 10.6 | 13.2 | 13.9 |
| Evaluation after heating | | A | A | A | A | A | A | C | C |
| Decrease in reflectance through light irradiation (%) | | 1.1 | 0.9 | 1.5 | 0.8 | 1.0 | 0.7 | 0.7 | 1.5 |
| Moldability | | A | A | A | A | A | B | A | A |

| | | Comparative Example | | | | | | | |
|---|---|---|---|---|---|---|---|---|---|
| | | 3 | 4 | 5 | 6 | 7 | 8 | 9 | 10 |
| Polyamide (A) | PA1 | 100 | 100 | 100 | 100 | 100 | 100 | 100 | 100 |
| | PA2 | | | | | | | | |
| Titanium oxide (B) | CR-90 | 56.6 | 56.6 | 56.6 | 56.6 | 56.6 | 56.6 | 56.6 | 56.6 |
| Magnesium oxide (C) | MF-150 | 3.8 | 3.8 | 3.8 | 3.8 | 3.8 | 3.8 | 3.8 | 0.0 |
| | MF-30 | | | | | | | | |
| Phenolic antioxidant | GA-80 | | | | | | | | |
| | IRGANOX1098 | | | | | | 0.19 | | 0.19 |
| | IRGANOX1010 | 0.38 | | | 0.19 | 0.19 | | | |
| | Hostanox03 | | 0.38 | | | | | 0.19 | |
| Phosphorus-containing antioxidant | IRGAFOS168 | | | | 0.19 | | 0.19 | 0.19 | 0.19 |
| | PEP36 | | | 0.38 | | 0.19 | | | |
| Reinforcing material (F) | Wollastonite | 28.3 | 28.3 | 28.3 | 28.3 | 28.3 | 28.3 | 28.3 | 28.3 |
| Light stabilizer (G) | S-EED | 0.57 | 0.57 | 0.57 | 0.57 | 0.57 | 0.57 | 0.57 | 0.57 |
| Release agent | | 0.57 | 0.57 | 0.57 | 0.57 | 0.57 | 0.57 | 0.57 | 0.57 |
| Nucleating agent | | 0.19 | 0.19 | 0.19 | 0.19 | 0.19 | 0.19 | 0.19 | 0.19 |
| Mass ratio [phenolic antioxidant/phosphorus-containing antioxidant] | | — | — | — | 1.0 | 1.0 | 1.0 | 1.0 | 1.0 |
| Initial reflectance (%) | | 97.2 | 97.0 | 96.5 | 96.7 | 96.5 | 97.0 | 96.8 | 96.8 |
| Decrease in reflectance through short-term heating (%) | | 5.5 | 6.5 | 8.5 | 6.8 | 7.1 | 4.9 | 6.8 | 7.6 |
| Decrease in reflectance through long-term heating (%) | | 16.0 | 14.6 | 11.0 | 13.2 | 16.3 | 15.6 | 15.5 | 11.8 |
| Evaluation after heating | | D | D | D | C | D | D | D | C |
| Decrease in reflectance through light irradiation (%) | | 1.2 | 1.1 | 0.4 | 1.2 | 1.1 | 1.6 | 1.0 | 1.0 |
| Moldability | | A | A | A | A | A | A | A | A |

TABLE 2

| | | Example | | | Comparative Example | | Example | | | | Comparative Example |
|---|---|---|---|---|---|---|---|---|---|---|---|
| | | 7 | 8 | 9 | 11 | 12 | 10 | 11 | 12 | 13 | 13 |
| Polyamide (A) | PA1 | 100 | 100 | 100 | 100 | 100 | 100 | 100 | 100 | | |
| | PA2 | | | | | | | | | 100 | 100 |
| Titanium oxide (B) | CR-90 | 69.0 | 69.0 | 69.0 | 69.0 | 69.0 | 72.9 | 72.9 | 72.9 | 69.0 | 69.0 |
| Magnesium oxide (C) | MF-150 | 3.4 | 3.4 | 3.4 | 3.4 | 3.4 | 4.2 | 4.2 | 4.2 | 3.4 | 3.4 |
| | MF-30 | | | | | | | | | | |
| Phenolic antioxidant | GA-80 | | | | 0.34 | | | | | | 0.34 |
| | IRGANOX1098 | 0.17 | 0.34 | 0.17 | | 0.34 | 0.21 | 0.21 | 0.21 | 0.17 | |
| | IRGANOX1010 | | | | | | | | | | |
| | Hostanox03 | | | | | | | | | | |
| Phosphorus-containing antioxidant | IRGAFOS168 | 0.17 | | 0.17 | | 0.34 | 0.21 | 0.21 | 0.21 | 0.17 | |
| | PEP36 | | | | | | | | | | |
| Reinforcing material (F) | Wollastonite | | | | | | 31.3 | 31.3 | 31.3 | | |
| Light stabilizer (G) | S-EED | 0.52 | 0.52 | 0.52 | 0.52 | 0.52 | 0.21 | 0.63 | 1.25 | 0.52 | 0.52 |
| Release agent | | 0.52 | 0.52 | 0.52 | 0.52 | 0.52 | 0.63 | 0.63 | 0.63 | 0.52 | 0.52 |
| Nucleating agent | | 0.17 | 0.17 | 0.17 | 0.17 | 0.17 | 0.21 | 0.21 | 0.21 | 0.17 | 0.17 |

TABLE 2-continued

| | Example | | | Comparative Example | | Example | | | | Comparative Example |
|---|---|---|---|---|---|---|---|---|---|---|
| | 7 | 8 | 9 | 11 | 12 | 10 | 11 | 12 | 13 | 13 |
| Mass ratio [phenolic antioxidant/phosphorus-containing antioxidant] | 1.0 | 2.0 | 0.50 | — | — | 1.0 | 1.0 | 1.0 | 1.0 | — |
| Initial reflectance (%) | 99.0 | 98.8 | 98.7 | 99.0 | 99.1 | 97.4 | 97.5 | 97.4 | 96.5 | 96.7 |
| Decrease in reflectance through short-term heating (%) | 4.1 | 4.1 | 4.4 | 6.4 | 4.6 | 5.0 | 5.3 | 5.6 | 5.4 | 7.4 |
| Decrease in reflectance through long-term heating (%) | 11.2 | 11.6 | 10.3 | 15.2 | 15.6 | 11.2 | 11.5 | 11.9 | 13.0 | 15.8 |
| Evaluation after heating | A | A | A | D | D | A | A | A | B | D |
| Decrease in reflectance through light irradiation (%) | 0.8 | 0.8 | 0.8 | 0.9 | 1.2 | 1.0 | 1.0 | 0.8 | 2.6 | 3.2 |

Components indicated in Tables were as follows.

[Polyamides (A)]

the polyamide PA1 obtained in Production Example 1 the polyamide PA2 obtained in Production Example 2

[Titanium Oxide (B)]

"Tipaque CR-90" (titanium dioxide, average particle diameter: 0.25 µm), manufactured by Ishihara Sangyo Kaisha Ltd.

[Magnesium oxides (C)]

"MF-150" (magnesium oxide, average particle diameter: 0.71 µm, BET specific surface area: 150 m²/g), manufactured by Kyowa Chemical Industry Co., Ltd.

"MF-30" (magnesium oxide, average particle diameter: 0.52 µm, BET specific surface area: 25 m²/g), manufactured by Kyowa Chemical Industry Co., Ltd.

[Phenolic Antioxidants (D)]

"Sumilizer GA-80" (3,9-bis[1,1-dimethyl-2-[β-(3-t-butyl-4-hydroxy-5-methylphenyl)propionyloxy]ethyl]-2,4,8,10-tetraoxaspiro[5.5]undecane), manufactured by Sumitomo Chemical Co., Ltd.

[Formula 11]

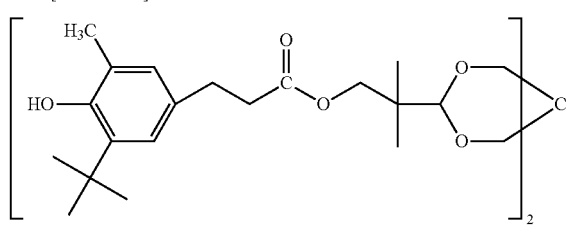

"IRGANOX 1098" (N,N'-hexamethylenebis[3-(3,5-di-t-butyl-4-hydroxyphenyl)propionamide]), manufactured by BASF Japan Co., Ltd.

[Formula 12]

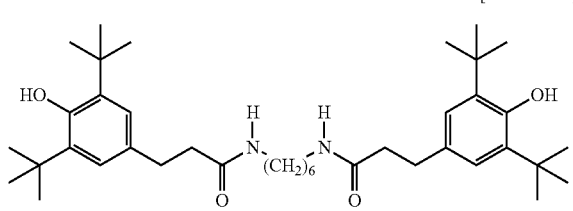

[Phenolic Antioxidants Other than (D)]

"IRGANOX 1010" (pentaerythrityl-tetrakis[3-(3,5-di-t-butyl-4-hydroxyphenyl)propionate]), manufactured by BASF Japan Co., Ltd.

[Formula 13]

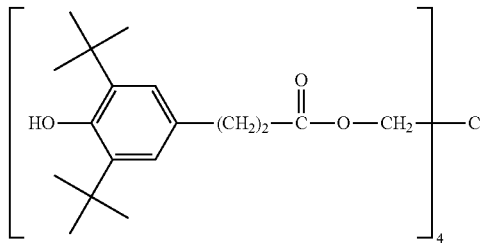

"Hostanox 03" (ethylene glycol bis[3,3-bis(3-t-butyl-4-hydroxyphenyl)butyrate]), manufactured by Clariant Japan K.K.

[Formula 14]

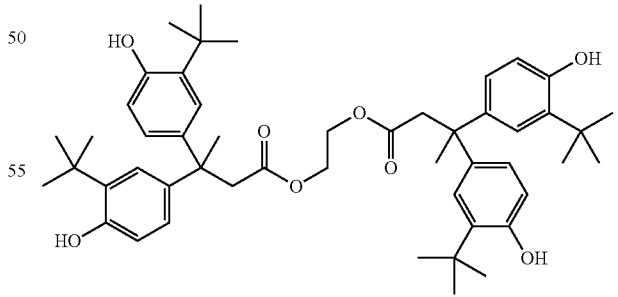

[Phosphorus-Containing Antioxidant (E)]

"IRGAFOS 168" (tris(2,4-di-t-butylphenyl) phosphite), manufactured by BASF Japan Co., Ltd.

[Formula 15]

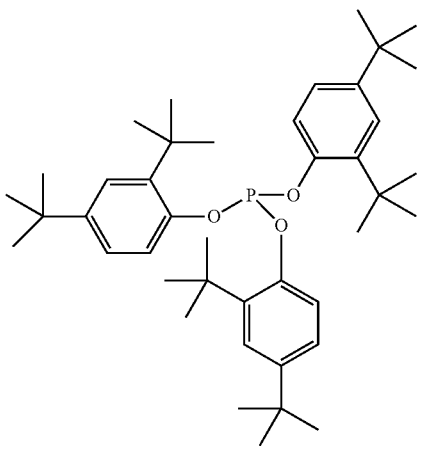

[Phosphorus-Containing Antioxidant Other than (E)]

"Adekastab PEP36" (3,9-bis(2,6-di-t-butyl-4-methylphenoxy)-2,4,8,10-tetraoxa-3,9-diphosphaspiro[5.5]undecane), manufactured by Adeka Corp.

[Formula 16]

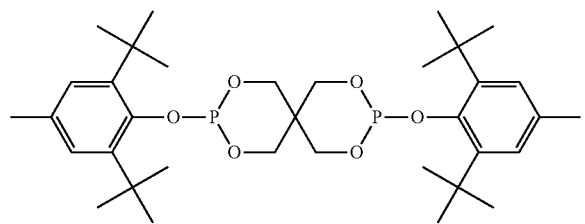

[Reinforcing Material (F)]

"SH-1250" (wollastonite, long-fibrous, average fiber diameter: 4.5 μm, average aspect ratio: 13), manufactured by Kinsei Matec Co., Ltd.

[Light Stabilizer (G)]

"Nylostab S-EED" (N,N'-bis(2,2,6,6-tetramethyl-4-piperidinyl-1,3-benzenedicarboxamide), manufactured by Clariant Japan K.K.

[Other Components]

Release agent: polypropylene of general type ("Hi-Wax NP055", manufactured by Mitsui chemicals Inc.)

Nucleating agent: talc ("Talc ML112", manufactured by Fuji Talc Industrial Co., Ltd.)

From the results of Examples and Comparative Examples, it is clear that the absence of any of a magnesium oxide (C), a specific phenolic antioxidant (D) and a specific phosphorus-containing antioxidant (E) result in no effect of the present invention.

Further as shown in Tables, it is clear that the LED reflection plate obtained by molding the polyamide composition of the present invention had a high light reflectance, and can show a small decrease in the light reflectance to maintain a high light reflectance both after short-term heating and after long-term heating even in the case of being exposed to heat supposed in production steps of LED packages and under the use environment.

INDUSTRIAL APPLICABILITY

A reflection plate obtained by molding the polyamide composition for an LED reflection plate of the present invention has a high light reflectance, and can show a small decrease in the light reflectance to maintain a high light reflectance both after short-time heating and after long-term heating even in the case of being exposed to heat supposed in production steps of LED packages and under the use environment. Hence, a light-emitting device comprising the reflection plate has a long life. Further the polyamide composition for an LED reflection plate of the present invention is excellent also in moldability.

REFERENCE SIGNS LIST

1,2,3 LIGHT-EMITTING DEVICE
10 SEMICONDUCTOR LIGHT-EMITTING ELEMENT
20 SUBSTRATE
30 REFLECTOR (HOUSING)
40 ENCAPSULATING MEMBER
50 PACKAGE-FORM SECTION
60 ENCAPSULATING MEMBER
70 SUBSTRATE
71 INTERCONNECT
80 LEAD FRAME

The invention claimed is:
1. A polyamide composition, comprising:
   a polyamide (A) having a melting point of 280° C. or higher and comprising a dicarboxylic acid unit and a diamine unit, where the dicarboxylic acid unit comprises 50% by mol or more of 1,4-cyclohexanedicarboxylic acid unit;
   a titanium oxide (B);
   a magnesium oxide (C);
   a phenolic antioxidant (D) which does not have 4 or more phenol structures in one molecule thereof; and
   a phosphorus-containing antioxidant (E); comprising 3 or more structures represented by the formula (1) in one molecule thereof:

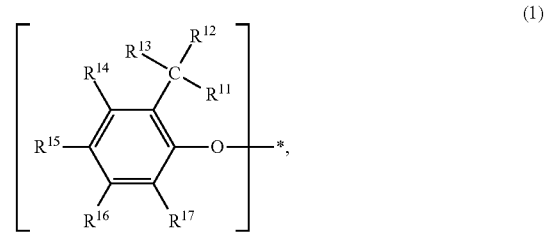

wherein $R^{11}$ to $R^{13}$ are each independently an alkyl group having 1 or 2 carbon atoms; and $R^{14}$ to $R^{17}$ are each independently a hydrogen atom or an alkyl group having 1 to 10 carbon atoms; and * represents a bonding site with a phosphorus atom,
wherein a content of the titanium oxide (B) is 10 to 100 parts by mass, a content of the magnesium oxide (C) is 0.50 to 15.0 parts by mass, and a content of the phenolic antioxidant (D) is 0.10 to 0.80 part by mass, with respect to 100 parts by mass of the polyamide (A), and mass ratio [(D) component/(E) component] of the phenolic antioxidant (D) to the phosphorus-containing antioxidant (E) is 0.25 or more and 3.0 or less.

2. The composition according to claim 1, wherein the diamine unit of the polyamide (A) comprises 50% by mol or more of an aliphatic diamine unit having 4 to 18 carbon atoms.

3. The composition according to claim 2, wherein the aliphatic diamine unit is at least one selected from the group consisting of a 1,9-nonanediamine unit and 2-methyl-1,8-octanediamine unit.

4. The composition according to claim 1, wherein the phenolic antioxidant (D) comprises 1 to 3 structures represented by the formula (2) in one molecule thereof:

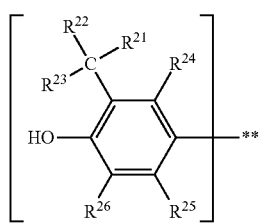

(2)

wherein $R^{21}$ to $R^{23}$ are each independently an alkyl group having 1 or 2 carbon atoms; $R^{24}$ to $R^{26}$ are each independently a hydrogen atom or an alkyl group having 1 to 10 carbon atoms; and ** represents a bonding site.

5. The composition according to claim 4, wherein in the formula (2), all of the groups represented by $R^{21}$ to $R^{23}$ are methyl groups; and the group represented by $R^{26}$ is a methyl group or a t-butyl group.

6. The composition according to claim 1, wherein the polyamide (A) is included in the composition in an amount of 30% by mass or higher and 80% by mass or lower.

7. The composition according to claim 1, wherein the BET specific surface area of the magnesium oxide (C) is 50 m²/g or larger.

8. The composition according to claim 1, further comprising a reinforcing material (F).

9. The composition according to claim 1, further comprising a light stabilizer (G).

10. An LED reflection plate, obtained by molding the composition according to claim 1.

11. A light-emitting device, comprising the LED reflection plate according to claim 10.

12. The composition according to claim 1, wherein a mass ratio [(C) component/(E) component] of the magnesium oxide (C) to the phosphorus-containing antioxidant (E) in the polyamide composition is 1.0 or more.

13. The composition according to claim 1, wherein the mass ratio [(D) component/(E) component] of the phenolic antioxidant (D) to the phosphorus-containing antioxidant (E) is 0.25 or more and 0.5 or less.

* * * * *